US012628593B2

(12) United States Patent
Saito et al.

(10) Patent No.: US 12,628,593 B2
(45) Date of Patent: May 12, 2026

(54) METHOD FOR TREATING TRANSITION METAL SEMICONDUCTOR, AND REDUCING AGENT-CONTAINING TREATMENT LIQUID FOR TRANSITION METAL OXIDE

(71) Applicant: TOKUYAMA CORPORATION, Yamaguchi (JP)

(72) Inventors: Kohei Saito, Yamaguchi (JP); Tomoaki Sato, Yamaguchi (JP); Yuki Kikkawa, Yamaguchi (JP); Takafumi Shimoda, Yamaguchi (JP); Takayuki Negishi, Yamaguchi (JP)

(73) Assignee: TOKUYAMA CORPORATION, Yamaguchi (JP)

( * ) Notice: Subject to any disclaimer, the term of this patent is extended or adjusted under 35 U.S.C. 154(b) by 276 days.

(21) Appl. No.: 18/267,880

(22) PCT Filed: Dec. 13, 2021

(86) PCT No.: PCT/JP2021/045736

§ 371 (c)(1),
(2) Date: Jun. 16, 2023

(87) PCT Pub. No.: WO2022/131186

PCT Pub. Date: Jun. 23, 2022

(65) Prior Publication Data

US 2024/0087911 A1 Mar. 14, 2024

(30) Foreign Application Priority Data

Dec. 18, 2020 (JP) ................................ 2020-210578
Apr. 12, 2021 (JP) ................................ 2021-067187

(51) Int. Cl.
*H10P 50/66* (2026.01)
*H10P 50/64* (2026.01)

(52) U.S. Cl.
CPC .......... *H10P 50/667* (2026.01); *H10P 50/642* (2026.01)

(58) Field of Classification Search
CPC ......... H01L 21/32134; H01L 21/30604; H01L 21/02068; H01L 21/304; H01L 21/306; H01L 21/308; C23F 1/00; C23F 1/40; C09K 13/02; C09K 13/04
USPC .......................................................... 438/745
See application file for complete search history.

(56) References Cited

U.S. PATENT DOCUMENTS 5,736,065 A 4/1998 Nakaso et al.
2001/0015345 A1 8/2001 Emami et al.
2001/0023701 A1 9/2001 Aoki et al.
2002/0060202 A1* 5/2002 Fukunaga ........... H01L 21/6708 257/E21.309
2003/0017419 A1 1/2003 Futase et al.
2004/0035717 A1 2/2004 Yamamoto et al.
2010/0216315 A1 8/2010 Yaguchi et al.
2013/0026134 A1 1/2013 Nakagawa et al.
2014/0154406 A1* 6/2014 Dordi ................ H01L 21/02068 134/29
2021/0062115 A1 3/2021 Shimoda et al.
2021/0189235 A1 6/2021 Sugimura et al.
2022/0056593 A1 2/2022 Takeda et al.

FOREIGN PATENT DOCUMENTS

| | | | |
|---|---|---|---|
| CN | 102592983 | 7/2012 | |
| EP | 0 692 800 | 1/1996 | |
| JP | 5-6876 | 1/1993 | |
| JP | 7-216564 | 8/1995 | |
| JP | 8-81222 | 3/1996 | |
| JP | 2000-183015 | 6/2000 | |
| JP | 2001-230230 | 8/2001 | |
| JP | 2001-234373 | 8/2001 | |
| JP | 2001-240985 | 9/2001 | |
| JP | 2002-161381 | 6/2002 | |
| JP | 2003-8199 | 1/2003 | |
| JP | 2004-137594 | 5/2004 | |
| JP | 2011-16975 | 1/2011 | |
| JP | 2014-53644 | 3/2014 | |
| JP | 2018-181984 | 11/2018 | |
| KR | 10-2005-0116739 | 12/2005 | |
| KR | 10-2014-0070496 | 6/2014 | |
| TW | 201311934 A * | 3/2013 | ......... G02F 1/13439 |
| WO | 2006/137497 | 12/2006 | |
| WO | 2019/142788 | 7/2019 | |
| WO | 2020/049955 | 3/2020 | |
| WO | 2020/179449 | 9/2020 | |

OTHER PUBLICATIONS

Langmuir, Formation of Gold Nanoparticles Using Amine Reducing Agents (Year: 2006).*
International Search Report issued Mar. 8, 2022 in International (PCT) Application No. PCT/JP2021/045736.
International Preliminary Report on Patentability issued Dec. 26, 2022 in International (PCT) Application No. PCT/JP2021/045736.

* cited by examiner

*Primary Examiner* — Duy Vu N Deo
(74) *Attorney, Agent, or Firm* — Wenderoth, Lind & Ponack, L.L.P.

(57) ABSTRACT

The present invention addresses the issue of providing a method for removing a transition metal oxide adhered to a transition metal film in a process for manufacturing a semiconductor element, and of providing a treatment liquid. Specifically, the present invention provides a method for treating a semiconductor of a transition metal, the method including, in a semiconductor formation process, a step of removing a transition metal oxide and a step of removing the transition metal. The present invention also provides a reducing agent-containing treatment liquid for a transition metal oxide, wherein the concentration of the reducing agent contained in the reducing agent-containing treatment liquid is 0.01 mass % or more and 50 mass % or less.

12 Claims, No Drawings

METHOD FOR TREATING TRANSITION METAL SEMICONDUCTOR, AND REDUCING AGENT-CONTAINING TREATMENT LIQUID FOR TRANSITION METAL OXIDE

TECHNICAL FIELD

The present invention relates to a method for treating a semiconductor of a transition metal, the method including a step of removing a transition metal oxide. The present invention also relates to a reducing agent-containing treatment liquid for a transition metal oxide.

BACKGROUND ART

In recent years, design rules for semiconductor elements have advanced in a direction of further miniaturization, and in association therewith, there has been a tendency for an increase in wiring resistance. A hindrance in high-speed operation of semiconductor elements as a result of this increase in wiring resistance has become obvious, and thus countermeasures have become necessary. Therefore, as wiring materials, a wiring material having higher electromigration resistance than known wiring materials, and a wiring material with a reduced resistance value are desired.

In comparison to the known wiring materials of aluminum and copper, ruthenium exhibits higher electromigration resistance and can reduce the resistance value of wiring, and for this reason, ruthenium is attracting attention particularly as a wiring material for semiconductor elements based on a design rule of 10 nm or less. Ruthenium can prevent electromigration of copper even when copper is used as the wiring material, and therefore the use of ruthenium as a barrier metal for copper wiring is also being examined in addition to its use as a wiring material.

Incidentally, even when ruthenium is selected as a wiring material in a wiring formation process of a semiconductor element, the wiring is formed on a semiconductor wafer by dry or wet etching, similar to known wiring materials. However, since it is difficult to etch and remove ruthenium by dry etching using an etching gas or by CMP polishing, more precise etching is desired, and specifically, wet etching is attracting attention.

When ruthenium is wet etched, the dissolution rate of the ruthenium, that is, the etching rate, is important. When the etching rate is high, ruthenium can be dissolved in a short amount of time, and thus the number of wafers treated per unit time can be increased. As a result, an improvement in productivity can be expected.

When ruthenium is wet etched, the surface of ruthenium after etching is required to flat. When the ruthenium surface is not flat, the flatness of the material formed on the ruthenium layer becomes poor, which causes a decrease in processing accuracy and a decrease in yield when manufacturing semiconductor elements. Further, when ruthenium is used as a wiring material, if the flatness of the ruthenium is reduced, its contact resistance with other wiring materials increases, resulting in a decrease in performance of the semiconductor element. In particular, with the advancement of miniaturization of wiring, flatness is strongly required in an etchback step (recess step) when forming multilayer wiring. For these reasons, a wet etching method having a high etching rate and providing excellent flatness of ruthenium is demanded.

Generally, a natural oxide layer is rapidly formed on a transition metal surface after film formation. When a wafer containing a transition metal is subjected to a CMP treatment, the transition metal is oxidized by an oxidizing agent contained in the CMP slurry, and a transition metal oxide is formed.

Various liquids have been proposed as treatment liquids used for wet etching a metal such as ruthenium in a semiconductor wafer. For example, Patent Document 1 proposes, as a method for etching a ruthenium film, a method in which a ruthenium film is etched using a chemical solution having a of 12 or higher and a standard oxidation-reduction potential of 300 mV vs. SHE (standard hydrogen electrode) or higher, more specifically, a solution containing an oxyacid salt of a halogen, such as a hypochlorite, a chlorite, or a bromate. Patent Document 2 proposes a cleaning method in which ruthenium is oxidized, dissolved, and removed using a removing solution obtained by adding a strong acid such as nitric acid to cerium (IV) ammonium nitrate.

Patent Document 3 proposes, as a treatment liquid for etching a metal in a semiconductor wafer, a wafer treatment liquid containing hypochlorite ions and a solvent, and having a pH of higher than 7 and lower than 12.0 at 25° C.

PRIOR ART DOCUMENTS

Patent Documents

Patent Document 1: JP 2002-161381 A
Patent Document 2: JP 2001-234373 A
Patent Document 3: WO 2019/142788

SUMMARY OF INVENTION

Technical Problem

When a transition metal is to be etched from a semiconductor wafer containing the transition metal, a high etching rate and excellent flatness of the transition metal are important. However, a study by the present inventors revealed that the existing treatment liquids described in the prior art documents have room for improvement in terms of the following.

The etchback step mentioned above requires accurate control of the etching rate on the surface to be treated. Specifically, surface roughness on the surface subjected to etching needs to be controlled at a level of about 3 nm or less. However, with regard to the treatment liquids described in Patent Documents 1 to 3, Patent Documents 1 to 3 do not mention the flatness of the treated surface after the etching treatment. Etching of the transition metal conducted by the present inventors using these treatment liquids revealed that while these treatment liquids achieve a high etching rate, controlling the surface roughness of the surface after etching is difficult, and thus there is room for improvement in terms of the flatness of the surface after etching.

Accordingly, the present invention was developed in view of the above problems, and an object of the present invention is to provide a semiconductor manufacturing method by which a transition metal can be etched at a sufficient rate from a semiconductor wafer containing the transition metal, and excellent flatness of the transition metal even after etching can be achieved. Another object of the present invention is to provide a reducing agent-containing treatment liquid that can reduce and remove a transition metal oxide present on a transition metal surface.

Solution to Problem

The present inventors conducted diligent research to solve the above problems. In addition, the present inventors discovered that the etching rate of a transition metal oxide present on the surface of a transition metal differs significantly from the etching rate of the transition metal, and flatness of the transition metal surface after etching is impaired due to a non-uniform distribution of the transition metal oxide. The present inventors also found that by removing the transition metal oxide, the impact of the transition metal oxide can be eliminated, and the transition metal can be etched at a high rate. Furthermore, the present inventors discovered that a transition metal surface having excellent flatness even after processing can be obtained by combining the removal of the transition metal oxide and the removal of the transition metal, or by carrying out these steps a plurality of times. The present inventors also found that the transition metal oxide can be efficiently removed by a treatment in which a reducing agent-containing treatment liquid, an alkaline solution, or sputtering is used. Moreover, the present inventors discovered that when the reducing agent in the reducing agent-containing treatment liquid is a borohydride compound, hydrogen, tin (II) chloride, an iodide, sulfurous acid, a sulfite, hypophosphorous acid, or a hypophosphite, the transition metal oxide can be more efficiently removed, and thereby the present inventors arrived at the present invention.

That is, the present invention is configured as follows.

Aspect 1: A method for treating a semiconductor of a transition metal, the method including a step of removing a transition metal oxide and a step of removing the transition metal.

Aspect 2: The method for treating a semiconductor of a transition metal according to aspect 1, the method including carrying out the step of removing the transition metal oxide a plurality of times.

Aspect 3: The method for treating a semiconductor of a transition metal according to aspect 1 or 2, the method including carrying out the step of removing the transition metal a plurality of times.

Aspect 4: The method for treating a semiconductor of a transition metal according to any one of aspects 1 to 3, wherein the step of removing the transition metal oxide is a step of removing the transition metal oxide using a reducing agent-containing treatment liquid, an alkaline solution, or sputtering.

Aspect 5: The method for treating a semiconductor of a transition metal according to aspect 4, wherein a concentration of the reducing agent contained in the reducing agent-containing treatment liquid is 0.1 mass % or more and 15 mass % or less.

Aspect 6: The method for treating a semiconductor of a transition metal according to aspect 4 or 5, wherein the reducing agent of the reducing agent-containing treatment liquid is a borohydride compound, hydrogen, a tin (H) compound, an iodide, sulfurous acid, a sulfite, hypophosphorous acid, or a hypophosphite.

Aspect 7: The method for treating a semiconductor of a transition metal according to aspect 4, wherein a concentration of an alkali contained in the alkaline solution is 0.05 mol/L or more and 15 mol/L or less.

Aspect 8: The method for treating a semiconductor of a transition metal according to aspect 4 or 7, wherein the alkali of the alkaline solution is an alkali metal hydroxide, an alkali metal carbonate, an alkali metal hydrogen carbonate, an alkaline earth metal hydroxide, an alkaline earth metal carbonate, an alkaline earth metal hydrogen carbonate, ammonia, ammonium carbonate, an amine, or an alkylammonium hydroxide.

Aspect 9: The method for treating a semiconductor of a transition metal according to aspect 8, wherein a concentration of the alkali metal hydroxide contained in the alkaline solution of the alkali metal hydroxide is 0.05 mol/L or more and 5 mol/L or less.

Aspect 10: The method for treating a semiconductor of a transition metal according to aspect 8, wherein a concentration of ammonia contained in the alkaline solution of ammonia is 3 mol/L or more and 15 mol/L or less.

Aspect 11: The method for treating a semiconductor of a transition metal according to aspect 8, wherein a concentration of an alkylammonium hydroxide contained in the alkaline solution of the alkylammonium hydroxide is 0.05 mol/L or more and 3 mon, or less.

Aspect 12: The method for treating a semiconductor of a transition metal according to any one of aspects 1 to 11, wherein the step of removing the transition metal is carried out by wet etching.

Aspect 13: The method for treating a semiconductor of a transition metal according to aspect 12, wherein a treatment liquid used in the wet etching is a solution containing a hypohalous oxyacid ion.

Aspect 14: The method for treating a semiconductor of a transition metal according to any one of aspects 1 to 13, wherein the transition metal is Ru, Rh, Co, Cu, Mo, or W.

Aspect 15: A method for manufacturing a semiconductor of a transition metal, the method including the method for treating a semiconductor of a transition metal according to any one of aspects 1 to 14.

Aspect 16: A reducing agent-containing treatment liquid for a transition metal oxide, wherein a concentration of a reducing agent contained in the reducing agent-containing treatment liquid is 0.01 mass % or more and 50 mass % or less.

Aspect 17: The reducing agent-containing treatment liquid according to aspect 16, wherein a pH of the reducing agent-containing treatment liquid at 25° C. is 7 or higher and 14 or lower.

Aspect 18: The reducing agent-containing treatment liquid according to aspect 16 or 17, wherein the reducing agent-containing treatment liquid contains water or an organic polar solvent.

Aspect 19: The reducing agent-containing treatment liquid according to aspect 18, wherein the organic polar solvent is an alcohol or acetone.

Aspect 20: The reducing agent-containing treatment liquid according to any one of aspects 16 to 19, wherein the reducing agent of the reducing agent-containing treatment liquid is a borohydride compound, hydrogen, a tin (II) compound, an iodide, sulfurous acid, a sulfite, hypophosphorous acid, or a hypophosphite.

Effects of Invention

According to the present invention, the step of removing a transition metal oxide contained in a semiconductor such as a semiconductor wafer is included, thus the impact of the transition metal oxide having a low etching rate can be eliminated, and as a result, the etching rate of the transition metal is improved. In addition, since the transition metal oxide unevenly present on the semiconductor wafer and the transition metal oxide generated during etching can be removed, a semiconductor having excellent flatness of the transition metal even after etching can be obtained. As a result, the number of wafers treated per unit time can be increased, and the time required for semiconductor manufacturing can be shortened. That is, an improvement in productivity can be expected. Further, since the surface of the transition metal is flat, processing accuracy is not reduced, and a reduction in the yield when manufacturing semiconductor elements is inhibited.

In addition, when the reducing agent-containing treatment liquid for a transition metal oxide of the present invention is used, the transition metal oxide contained in a semiconductor wafer can be chemically reduced in an efficient manner. As a result, the reduced transition metal is easily processed, the number of wafers treated per unit time can be increased, and the time required for semiconductor manufacturing can be shortened.

DESCRIPTION OF EMBODIMENTS

According to the present invention, a method for treating a semiconductor of a transition metal includes a step of removing a transition metal oxide and a step of removing the transition metal. The present invention also relates to a reducing agent-containing treatment liquid for a transition metal oxide, the reducing agent-containing treatment liquid having a concentration of 0.01 mass % or more and 50 mass % or less.

Description will be made in order below.

(Transition Metal and Transition Metal Oxide Contained in Semiconductor Wafer)

In the present embodiment, the transition metal refers to a metal element of Groups 3 to 12. Examples thereof include metals such as Ti, V, Cr, Mn, Fe, Co, Ni, Cu, Zr, Nb, Mo, Ru, Rh, Pd, Ag, Hf, Ta, W, Re, Os, Ir, Pt, and Au. The term transition metal compound refers to a compound composed of the above transition metal and nitrogen, phosphorus, sulfur, silicon, carbon, boron, halogen, or the like. When a semiconductor is manufactured, these transition metals, transition metal compounds, and transition metal oxides may be contained in the semiconductor wafer, and can be formed by any method. The expression "contained in the semiconductor wafer" includes being contained in the semiconductor wafer, being in contact with a substrate, and being present on the wafer through another component, and does not depend on the position at which the chemical species is present or the state of the chemical species.

The transition metal that can be contained in the semiconductor is not particularly limited, but in consideration of use in a semiconductor wafer, the transition metal is preferably Ti, V, Cr, Mn, Co, Ni, Cu, Mo, Ru, Rh, Ta, W, or HE Among these metals, the transition metal is more preferably Ru, Rh, Co, Cu, Mo, or W, which are useful as a wiring layer. Furthermore, in consideration of the removal efficiency of the transition metal oxide, the transition metal is even more preferably Ru, Mo, or W, and Ru is particularly preferable. The metal can be formed into a film through any method, and a method widely known in a semiconductor manufacturing process can be used, including, for example, CVD, ALD, PVD, sputtering, or plating.

(Transition Metal Oxide)

The transition metal oxide in the present embodiment is an oxide of the abovementioned transition metal. The transition metal oxide includes not only a compound containing a transition metal and oxygen and represented by a general formula of $M_xO_y$ (where M represents a transition metal, O represents oxygen, and x and y represent amount ratios of the transition metal and oxygen, respectively), but also a solid in which the valence of the transition metal is positive. That is, even when an element other than oxygen is contained, as long as the valence of the transition metal is positive, the transition metal oxide is treated as the transition metal oxide of the present embodiment. In addition, the method for forming the transition metal oxide is not limited, and the transition metal oxide can have any shape, thickness, or size, can be produced by any processing such as manufacturing, for example, or can be formed by natural oxidation. A case in which ruthenium is used as the transition metal is specifically described below. When ruthenium is used, the semiconductor method of the present embodiment is a method that includes a ruthenium oxide removal step and a ruthenium removal step. The method will be described in order below.

(Ruthenium Contained in Semiconductor Wafer)

In the present embodiment, a semiconductor of ruthenium means a semiconductor containing ruthenium. Also note that the semiconductor of a transition metal means a semiconductor containing a transition metal. In the present embodiment, the term ruthenium means a ruthenium-based metal or a ruthenium alloy. In the present embodiment, the ruthenium contained in a semiconductor wafer can be formed by any method. In a case in which a film of ruthenium is to be formed, methods widely known in a semiconductor manufacturing process can be used, including, for example, CVD, ALD, PVD, sputtering, or plating.

In the present embodiment, the term "ruthenium-based metal" refers to metal ruthenium itself, as well as a compound composed of a ruthenium metal containing ruthenium, and an element such as nitrogen, phosphorus, sulfur, silicon, carbon, boron, or halogen. In addition, in the present embodiment, the term "ruthenium alloy" refers to an alloy containing ruthenium and a metal other than ruthenium at a concentration higher than a concentration at which the other metal is unavoidably contained.

In the present embodiment, when it is not necessary to particularly distinguish between a ruthenium-based metal and a ruthenium alloy, they are described as ruthenium. The ruthenium alloy can contain any metal in addition to ruthenium, and examples of the metal contained in the ruthenium alloy include tantalum, silicon, copper, hafnium, zirconium, aluminum, vanadium, cobalt, nickel, manganese, gold, rhodium, palladium, titanium, tungsten, molybdenum, platinum, and iridium. The ruthenium alloy can contain an oxide, a nitride, a carbide, or a silicide of these metals.

The abovementioned ruthenium can be an intermetallic compound, an ionic compound, or a complex. In addition, the ruthenium can be exposed at the surface of the wafer or covered with another metal, a metal oxide film, an insulating film, a resist, or the like.

(Ruthenium Oxide)

In the present embodiment, the ruthenium oxide is a solid compound (hereinafter, may be represented by the chemical formula $RuO_x$) that contains ruthenium and oxygen and is contained in the semiconductor war. Examples of the ruthenium oxide include ruthenium monoxide (RuO), ruthenium dioxide ($RuO_2$), ruthenium dioxide dihydrate ($RuO_2(OH)_2$), ruthenium trioxide ($RuO_3$), ruthenium tetroxide ($RuO_4$), diruthenium pentoxide ($Ru_2O_5$), and ruthenium oxynitride (RuNO). Ruthenium tetroxide dissolves in water, but when contained in a semiconductor wafer as a solid, ruthenium tetroxide is treated as the ruthenium oxide of the present embodiment. Furthermore, solid compounds containing anions such as $$RuO_4^-,\ RnO_4^{2-},\ \text{and}\ HRuO_5^-$$

are also ruthenium oxides of the present embodiment. For example, the ruthenium oxide may be a salt containing the abovementioned anion.

In the present embodiment, the ruthenium oxide is not particularly limited as long as it is a solid. Examples of the ruthenium oxide include a ruthenium oxide that is produced when a ruthenium film is polished by CMP, a natural oxide layer, a ruthenium oxide that it produced by oxidizing ruthenium with an oxidizing agent or the like, a ruthenium oxide that is produced when ruthenium is etched, or a ruthenium oxide film that is produced by forming a film of ruthenium oxide. Moreover, the thickness, shape and the presence amount of the ruthenium oxide are not particularly limited. The ruthenium oxide can be present at any position of the semiconductor wafer, and for example, can be present on the back surface, an edge portion, or the front surface of the semiconductor wafer.

<Ruthenium Oxide Removal Step>

Removal of the ruthenium oxide in the present embodiment is a step of removing the ruthenium oxide by, for example, a chemical or physical method. Removing the ruthenium oxide enables etching of the ruthenium at a sufficient rate and inhibits a decrease in flatness after etching.

The method used in the ruthenium oxide removal step is not limited to a specific method, and any method can be used as long as at least part of the ruthenium oxide contained in the semiconductor wafer is removed. As such a method, a method of removing the ruthenium oxide using a reducing agent-containing treatment liquid, a method of removing the ruthenium oxide using an alkaline solution, and a method of removing the ruthenium oxide by sputtering can be suitably used. The reducing agent-containing treatment liquid can be a below-described reducing agent-containing treatment liquid for a transition metal oxide.

(Reducing Agent-Containing Treatment Liquid for Transition Metal Oxide)

The reducing agent-containing treatment liquid for a transition metal oxide is a treatment liquid containing a reducing agent for reducing the transition metal oxide. The reducing agent-containing treatment liquid for a transition metal oxide contains at least a reducing agent and a solvent. When the reducing agent-containing treatment liquid for a transition metal oxide is brought into contact with the transition metal oxide, the reducing agent can reduce all or part of the transition metal oxide and lower the valence of the transition metal.

The reducing agent contained in the reducing agent-containing treatment liquid for a transition metal oxide can be appropriately selected according to the type of metal oxide, the amount contained in the semiconductor wafer, the treatment method, and the like. Examples of such a reducing agent include a borohydride compound, a carboxylic acid-based reducing agent, hydrogen, a salt containing a reducing metal ion, a metal hydride, a metal-based reducing agent, an iodide, hydrogen peroxide, a sulfur-containing reducing agent, a phosphorus-containing reducing agent, a nitrogen-containing reducing agent, an aldehyde-based reducing agent, and a polyhydric phenol. Among these reducing agents, from the viewpoint of the efficiency of removing the transition metal oxide and the handling safety of the reducing agent-containing treatment liquid, borohydride compounds, hydrogen, tin (II) compounds, iodides, sulfurous acid, sulfites, hypophosphorous acid, hypophosphites, and the like are preferable. Further, in consideration of manufacturing safety, borohydride compounds, tin (II) compounds, iodides, sulfurous acid, sulfites, hypophosphorous acid, hypophosphites and the like are more preferable.

The reducing agent in the reducing agent-containing treatment liquid for a transition metal oxide can be contained at a concentration at which part or all of the transition metal oxide contained in the semiconductor wafer can be reduced and removed. The concentration of the reducing agent in the reducing agent-containing treatment liquid for a transition metal oxide can be appropriately adjusted with consideration of details such as the oxidation state (valence), presence amount, and presence site of the transition metal oxide contained in the wafer, the treatment conditions, and the type and valence of the reducing agent. From the viewpoints of the removal efficiency of the transition metal oxide, and the storage stability and handling safety of the reducing agent-containing treatment liquid, the concentration of the reducing agent is preferably 0.01 mass % or more and 50 mass % or less, more preferably 0.01 mass % or more and 30 mass % or less, still more preferably 0.1 mass % or more and 30 mass % or less, and particularly preferably 0.1 mass % or more and 20 mass % or less. When the concentration of the reducing agent is within the abovementioned range, the transition metal oxide can be reduced at a sufficient rate and efficiently removed.

The pH of the reducing agent-containing treatment liquid for a transition metal oxide is not particularly limited, and can be a pH at which a reducing power is exhibited for reducing and removing part or all of the transition metal oxide contained in the semiconductor wafer. The pH of the reducing agent-containing treatment liquid for a transition metal oxide can be appropriately adjusted with consideration of details such as the type, oxidation state (valence), presence amount, and presence site of the transition metal oxide contained in the semiconductor wafer, the treatment conditions, and the type and valence of the reducing agent. For example, when the transition metal oxide is a ruthenium oxide or a platinum oxide, the pH is preferably 7 or higher and 14 or lower from the viewpoints of the removal efficiency of the oxide, and storage stability and handling safety of the reducing agent-containing treatment liquid. Further, when the transition metal oxide is a cobalt oxide or a nickel oxide, the pH of the reducing agent-containing treatment liquid can be a pH at which a reducing power is exhibited for reducing and removing part or all of the transition metal oxide contained in the semiconductor wafer.

(Removal of Ruthenium Oxide by Reduction)

A method of removing the ruthenium oxide using the reducing agent-containing treatment liquid described above can be suitably used as the step of removing the ruthenium oxide. At least part of the ruthenium oxide contained in the semiconductor wafer can be reduced and removed by bringing the reducing agent-containing treatment liquid into contact with the ruthenium oxide. Removing the ruthenium oxide enables etching of the ruthenium at a sufficient rate and inhibits a decrease in flatness after etching.

In a case of reducing ruthenium oxide, the reducing agent in the reducing agent-containing treatment liquid can be any reducing agent as long as the reducing agent can reduce the valence of the ruthenium atom contained in the ruthenium oxide. Examples of such a reducing agent include a borohydride compound, a carboxylic acid-based reducing agent, hydrogen, a salt containing a reducing metal ion, a metal hydride, a metal-based reducing agent, an iodide, hydrogen peroxide, a sulfur-containing reducing agent, a phosphorus-containing reducing agent, a nitrogen-containing reducing agent, an aldehyde-based reducing agent, and a polyhydric phenol. Among these reducing agents, borohydride compounds, hydrogen, tin (ft) compounds, iodides, sulfurous acid, sulfites, hypophosphorous acid, hypophosphites, and the like are preferable from the viewpoint of the removal efficiency of the ruthenium oxide and the handling safety of the reducing agent-containing treatment liquid. Further, in consideration of manufacturing safety, borohydride compounds, tin (II) compounds, iodides, sulfurous acid, sulfites, hypophosphorous acid, hypophosphites and the like are more preferable.

Examples of the borohydride compounds include borane compounds and borohydrides. These borohydride compounds are preferable because in comparison to a method in which hydrogen is present in an aqueous solution, a larger amount of hydrogen can be present in the vicinity of the interface between the ruthenium oxide and the reducing agent-containing treatment liquid, and a high-concentration hydrogen can be generated more safely. Examples of the borane compounds include diborane, amine boranes, borane complexes, and substituted boranes. Examples of the amine boranes include ammonia borane, dimethylamine borane, diethylamine borane, trimethylamine borane, triethylamine borane, and ethane-1,2-diamine borane. Examples of the borane complexes include borane pyridine, borane 2-methylpyridine, borane morpholine, borane tetrahydrofuran, borane diethylether, and borane dimethylsulfide. Examples of the substituted boranes include haloboranes, such as dichloroborane or dibromoborane, and alkylboranes, such as 2,3-dimethyl-2-butylborane.

Examples of the borohydrides include metal borohydride salts and derivatives thereof, and tetraalkylammonium borohydrides. Examples of the metal borohydride salts include sodium borohydride, lithium borohydride, potassium borohydride, zinc borohydride, and calcium borohydride. Examples of derivatives of the metal borohydride salts include sodium trimethoxyborohydride, sodium acetoxyborohydride, lithium triethylborohydride, lithium tri(sec-butyl) borohydride, potassium tri(sec-butyl) borohydride, sodium cyanoborohydride, and sodium borohydride sulfide. Examples of the tetraalkylammonium borohydrides include tetramethylammonium borohydride, tetraethylammonium borohydride, and tetrabutylammonium borohydride.

Examples of the carboxylic acid-based reducing agent include carboxylic acids such as oxalic acid, formic acid, ascorbic acid, and 3,4,5-trihydroxybenzoic acid, and salts thereof.

Examples of the salt containing a reducing metal ion include tin (II) compounds, iron (II) compounds, iridium (III) compounds, chromium (II) compounds, cerium (III) compounds, titanium (III) compounds, and vanadium (II) compounds. Examples of the tin (II) compounds include tin (II) chloride. Examples of the iron (II) compounds include iron (II) sulfate. Examples of the iridium (III) compounds include iridium (III) chloride. Examples of the chromium (II) compounds include chromium (II) chloride, chromium (II) sulfate, chromium (II) acetate, and chromium (II) perchlorate. Examples of the cerium (Ill) compounds include cerium (III) hydroxide. Examples of the titanium (III) compounds include titanium (III) chloride. Examples of the vanadium (II) compounds include vanadium (II) sulfate and vanadium (II) chloride.

Examples of the metal hydride include sodium hydride, aluminum hydride compounds, hydrosilanes, and hydrotins. Examples of the aluminum hydride compounds include lithium aluminum hydride, diisobutylaluminum hydride, sodium bis(2-methoxyethoxy) aluminum hydride, lithium tri-tert-butoxyaluminum hydride, and aluminum hydride. Examples of the hydrosilanes include monosilane, trimethylsilane, triethylsilane, triphenylsilane, diphenylsilane, phenylsilane, trimethoxysilane, and trichlorosilane. Examples of the hydro-tins include tributyltin.

Examples of the metal-based reducing agent include alkali metals, alkaline earth metals, magnesium, zinc powder, zinc flower, aluminum amalgam, aluminum nickel, tin powder, tin amalgam, and iron powder.

Examples of the iodide include sodium iodide, potassium iodide, hydroiodic acid, and alkylammonium iodides.

Examples of the sulfur-containing reducing agent include sulfur dioxide, hydrogen sulfide, sulfamic acid, sulfurous acid-based compounds, dithionous acid, dithionites, thiosulfuric acid, and thiosulfates. Examples of the sulfurous acid-based compounds include sulfurous acid; sulfites such as zinc sulfite, ammonium sulfite, calcium sulfite, sodium sulfite, magnesium sulfite, and tetraalkylammonium sulfite; sodium hydrogen sulfite; and sodium pyrosulfite. Examples of the dithionites include sodium dithionite. Examples of the thiosulfates include sodium thiosulfate.

Examples of the phosphorus-containing reducing agent include phosphorous acid, phosphites, hypophosphorous acid, hypophosphites, and phosphines. Examples of the phosphites include sodium phosphite, potassium phosphite, triethyl phosphite, and trimethyl phosphite. Examples of the hypophosphites include sodium hypophosphite, calcium hypophosphite, aluminum hypophosphite, and tetraalkylammonium hypophosphite. Examples of the phosphines include triphenylphosphine.

Examples of the nitrogen-containing reducing agent include nitrous acid, nitrites, hydroxylamine, hydroxylamine salts, hydrazine, and hydrazine derivatives. Examples of the nitrites include sodium nitrite, ammonium nitrite, and tetraalkylammonium nitrite. Examples of the hydroxylamine salts include hydroxylamine hydrochloride. Examples of the hydrazine derivatives include diazene and monomethylhydrazine.

Examples of the aldehyde-based reducing agent include formaldehyde, acetaldehyde, and reducing sugars. Examples of the reducing sugars include glucose, fructose, glyceraldehyde, lactose, arabinose, and maltose.

Examples of the polyhydric phenol include cresol, catechol, resorcinol, hydroquinone, pyrogallol, and phloroglucinol.

From the perspective of handling safety and because of the ease of procurement of inexpensive, high-purity products, preferable reducing agents among these reducing agents include ammonia borane, borane dimethylamine, borane diethylamine, sodium borohydride, tetraalkylammonium borohydride, oxalic acid, formic acid, ascorbic acid, hydrogen, tin (II) chloride, iron (II) sulfate, potassium iodide, alkylammonium iodide, hydrogen peroxide, sulfur dioxide, sulfurous acid, sulfites, sodium thiosulfate, sodium phosphite, triethyl phosphite, hypophosphorous acid, hypophosphites, triphenylphosphine, and nitrites. Furthermore, ammonia borane, borane dimethylamine, borane diethylamine, sodium borohydride, tetraalkylammonium borohydride, hydrogen, tin (II) chloride, potassium iodide, alkylammonium iodide, sulfites, and hypophosphites are more preferable from the perspective of being able to rapidly reduce and efficiently remove ruthenium oxide. Moreover, in consideration of manufacturing safety, ammonia borane, borane dimethylamine, borane diethylamine, sodium borohydride, tetraalkylammonium borohydride, tin (II) chloride, potassium iodide, alkylammonium iodide, sulfites, and hypophosphites are more preferable. In addition, ammonia borane, borane dimethylamine, borane diethylamine, tetraalkylammonium borohydride, alkylammonium iodide, tetraalkylammonium sulfite, and tetraalkylammonium hypophosphite are most preferable from the viewpoint of not containing metal atoms that cause problems in semiconductor production.

The solvent used in the reducing agent-containing treatment liquid can be any solvent as long as it is a solvent in which the reducing agent is easily dissolved or a solvent in which the reducing agent is stably present. By using a solvent in which the reducing agent is easily dissolved, the concentration can be adjusted in a wide concentration range. As a result, the ruthenium oxide can be efficiently removed according to the ruthenium oxide contained in the semiconductor wafer. By using a solvent in which the reducing agent is stably present, the usable period of the reducing agent-containing treatment liquid can be extended. As a result, productivity is improved. A single type of solvent can be used, or multiple types of solvents can be used. As these solvents, for example, polar solvents such as water, alcohols, ketones, nitriles, ethers, esters, carboxylic acids, sulfur-containing compounds, and nitrogen-containing compounds are preferable from the viewpoint of improving the etching rate of the transition metal. Examples of the alcohol polar solvents include methanol, ethanol, 1-propanol, 2-propano 1-butanol, 2-butanol, 1-pentanol, 1-hexanol, ethylene glycol, and glycerin. Examples of ketone polar solvents include acetone. Examples of nitrile polar solvents include acetonitrile and propanenitrile. Examples of ether polar solvents include tetrahydrofuran. Examples of ester polar solvents include methyl acetate, ethyl acetate, and propylene carbonate. Examples of carboxylic acid polar solvents include formic acid and acetic acid. Examples of polar solvents of sulfur-containing compounds include dimethyl sulfoxide, dimethyl sulfone, and sulfolane. Examples of polar solvents of nitrogen-containing compounds include N,N-dimethylformamide, N-methyl-2-pyrrolidone, acetamide, and nitromethane.

Among these solvents, water, methanol, ethanol, 1-propanol, 2-propanol, 1-butanol, acetone, acetonitrile, tetrahydrofuran, ethyl acetate, formic acid, acetic acid, dimethyl sulfoxide, and N,N-dimethylformamide are preferable because high-purity products are easily procured at a low cost. Furthermore, water, methanol, ethanol, 1-propanol, 2-propanol, 1-butanol, acetone, and acetonitrile are more preferable from the viewpoint of being able to rapidly reduce and efficiently remove ruthenium oxide. Furthermore, water, methanol, ethanol, 2-propanol, and acetone are most preferable from the viewpoint of easily procuring high-purity products for semiconductors.

Using water as the solvent of the reducing agent-containing treatment liquid of the present embodiment is one of the most preferable modes. Water contained in the reducing agent-containing treatment liquid is preferably water from which metal ions, organic impurities, particles, or the like have been removed by distillation, ion exchange, filtration, various types of adsorption treatments, or the like, and pure water or ultrapure water is particularly preferable.

An organic polar solvent contained in the reducing agent-containing treatment liquid according to the present embodiment is preferably a solvent from which metal ions, organic impurities, particles, or the like have been removed by distillation, ion exchange, filtration, various types of adsorption treatments, or the like.

The concentration of the reducing agent in the reducing agent-containing treatment liquid can be a concentration at which part or all of the ruthenium oxide contained in the semiconductor wafer can be reduced and removed. The concentration of the reducing agent can be appropriately adjusted with consideration of details such as the oxidation state (valence), presence amount, and presence site of the ruthenium oxide contained in the semiconductor wafer, the treatment conditions, and the type and valence of the reducing agent. From the viewpoint of the removal efficiency of the ruthenium oxide, and the storage stability and handling safety of the reducing agent-containing treatment liquid, the concentration of the reducing agent is preferably 0.1 mass % or more and 20 mass % or less, and more preferably 0.1 mass % or more and 15 mass % or less. When the concentration of the reducing agent is within the abovementioned range, the ruthenium oxide can be reduced at a sufficient rate and efficiently removed.

When, for example, a sodium borohydride solution is used as the reducing agent-containing treatment liquid in the present invention, the concentration range of the reducing agent is preferably 0.1 mass % or more and 20 mass % or less in consideration of the removal efficiency of the ruthenium oxide and the storage stability of the reducing agent-containing treatment liquid. Furthermore, in consideration of handling safety, the concentration is more preferably 0.1 mass % or more and 15 mass % or less, and most preferably 0.1 mass % or more and 10 mass % or less.

When, for example, a tetraalkylammonium borohydride solution is used as the reducing agent-containing treatment liquid in the present embodiment, the concentration range of the tetraalkylammonium borohydride is preferably 0.1 mass % or more and 20 mass % or less in consideration of the removal efficiency of the ruthenium oxide and the storage stability of the reducing agent-containing treatment liquid. Further, in consideration of handling safety, the concentration is more preferably 0.1 mass % or more and 10 mass % or less.

When, for example, a sulfite solution is used as the reducing agent-containing treatment liquid in the present embodiment, the concentration range of the sulfite solution is preferably 0.5 mass % or more and 15 mass % or less in consideration of the removal efficiency of the ruthenium oxide and the storage stability of the reducing agent-containing treatment liquid. Further, in consideration of the removal efficiency of the ruthenium oxide, the concentration is more preferably 1 mass % or more and 15 mass % or less.

The temperature at which the ruthenium oxide is removed by the reducing agent-containing treatment liquid is not particularly limited, and can be determined with consideration of details such as the type and stability of the reducing agent used, the removal efficiency of the ruthenium oxide, and the treatment safety. As one example, the temperature thereof is preferably −20° C. or higher and 90° C. or lower, more preferably 0° C. or higher and 90° C. or lower, and most preferably 10° C. or higher and 70° C. or lower. When the temperature is within the above temperature range, the ruthenium oxide can be favorably reduced and efficiently removed.

The treatment time when removing the ruthenium oxide using the reducing agent-containing treatment liquid is not particularly limited and can be appropriately selected with consideration of details such as the type and concentration of the reducing agent used, the removal efficiency of the ruthenium oxide, the semiconductor used, the thickness of the ruthenium oxide, or the like. As one example, the treatment time can be 0.1 minutes or more and 600 minutes or less, preferably 0.1 minutes or more and 120 minutes or less, and more preferably 0.5 minutes or more and 60 minutes or less. When the treatment time is within the above time range, the ruthenium oxide can be rapidly reduced and efficiently removed.

The rinsing liquid after the treatment with the reducing agent-containing treatment liquid is not particularly limited, and rinsing with deionized water alone is sufficient.

As the reducing agent-containing treatment liquid, a solution containing a metal protective agent such as a surfactant or a ligand coordinated to a metal can be used. By including these metal protective agents, ruthenium can be protected at the same time as chemical reduction, and by carrying out a step of removing ruthenium after the ruthenium has been protected, a decrease in the flatness of ruthenium can be further inhibited.

As such a surfactant that can be contained in the reducing agent-containing treatment liquid, any surfactant that adsorbs to ruthenium or ruthenium oxide can be used, and the surfactant can be an ionic surfactant or a nonionic surfactant. Among such surfactants, the surfactant is preferably an ionic surfactant from the viewpoint of exhibiting excellent solubility in a solvent and ease of concentration adjustment. Examples of such ionic surfactants include anionic surfactants such as carboxylic acid-based, sulfonic acid-based, sulfate-based and phosphate-based surfactants; cationic surfactants such as alkylamine-based and quaternary ammonium salt-based surfactants; and amphoteric surfactants such as carboxybetaine-based, imidazoline derivative-based, glycine-based and amine oxide-based surfactants. When the reducing agent-containing treatment liquid contains a metal protective agent such as a surfactant or a ligand that coordinates to a metal, the concentration of the surfactant or the ligand that coordinates to a metal can be appropriately determined according to the metal species or metal oxide species treated by the reducing agent-containing treatment liquid, the type of the surfactant or ligand that coordinates to the metal, the solvent contained in the reducing agent-containing treatment liquid, or the treatment conditions. For example, when the concentration of the surfactant or ligand that coordinates to a metal is from 0.001 ppm by mass to 10 mass %, the decrease in flatness of the metal can be further inhibited.

The cationic surfactant is more preferably a quaternary ammonium salt-based cationic surfactant from the viewpoint of being easy to procure industrially and being more stably present in the reducing agent-containing treatment liquid. An example of such a quaternary ammonium salt-based cationic surfactant is an alkylammonium salt represented by Formula (1) below.

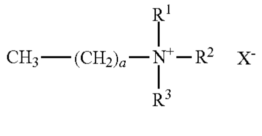

(1)

(Where a is an integer of 2 to 20, $R^1$, $R^2$, and $R^3$ are each independently a hydrogen atom or an alkyl group having a carbon number from 1 to 20, and $X^-$ is an anion.)

The integer a in the above formula (1) represents the number of methylene groups, and is not particularly limited as long as the integer a is from 2 to 20, but the integer a is more preferably from 4 to 18, and even more preferably from 6 to 16. Any alkylammonium salt having a number of methylene groups within the above-described range can be suitably used because such an alkylammonium salt is adsorbed on the transition metal surface to form an appropriate protective layer. In addition, as the integer a of the alkylammonium salt increases, the amount of alkylammonium ions of the alkylammonium salt adsorbed onto the transition metal surface increases, and thus efficient removal of the ruthenium oxide using the reducing agent tends to become more difficult. In addition, when the integer a of the alkylammonium salt is large, water solubility of the alkylammonium salt decreases, which causes the generation of particles in the treatment liquid and results in a decrease in the yield of semiconductor elements. On the other hand, as the integer a of the alkylammonium salt becomes smaller, the adsorption amount onto the transition metal surface decreases, an appropriate protective layer is not formed on the transition metal surface, and the effect of inhibiting a decrease in the flatness of ruthenium is weakened.

Moreover, $R^1$, $R^2$, and $R^3$ in the formula (1) are each independently a hydrogen atom or an alkyl group having a carbon number from 1 to 20, and are optionally the same or different. $R^1$, $R^2$, and $R^3$ are each preferably an alkyl group having a carbon number from 1 to 20. Further, the carbon number of each of $R^1$, $R^2$, and $R^3$ is preferably equal to or smaller than the integer a, and any one of $R^1$, $R^2$, and $R^3$ is more preferably a methyl group. When any one of $R^1$, $R^2$, and $R^3$ is a methyl group, a more uniform and dense protective layer is formed on the transition metal surface, and a decrease in the flatness of ruthenium can be further inhibited.

$X^-$ in the above formula (1) is an anion, and examples thereof include a fluoride ion, a chloride ion, a bromide ion, an iodide ion, a hydroxide ion, a nitrate ion, a phosphate ion, a sulfate ion, a hydrogen sulfate ion, a sulfite ion, a methane sulfate ion, an acetate ion, a carbonate ion, a hydrogen carbonate ion, a fluoroborate ion, and a trifluoroacetate ion.

Examples of ionic surfactants include carboxylic acid-based surfactants, such as aliphatic monocarboxylate salts, polyoxyethylene alkyl ether carboxylate salts, N-acylsarcosinate salts, N-acylglutamate salts and alpha-sulfofatty acid ester salts; sulfonic acid-based surfactants, such as dialkylsulfosuccinate salts, alkane sulfonate salts, alpha-olefin sulfonate salts, alkylbenzene sulfonate salts, naphthalene sulfonate salt-formaldehyde condensates, alkylnaphthalene sulfonate salts and N-methyl-N-acyltaurate salts; sulfate-based surfactants, such as alkylsulfate salts, polyoxyethylene alkyl ether sulfate salts and fat and oil sulfate salts; phosphate-based surfactants, such as alkyl phosphate salts, polyoxyethylene alkylether phosphate salts, and polyoxyethylene alkylphenyl ether phosphate salts; alkylamine salt-based surfactants, such as monoalkylamine salts, dialkylamine salts and trialkylamine salts; quaternary ammonium salt-based surfactants, such as alkyltrimethylammonium halides, dialkyldimethylammonium halides and alkylbenzalkonium halides; carboxybetaine-based surfactants, such as alkylbetaines and fatty acid amidoalkylbetaines; imidazoline derivative-based surfactants, such as 2-alkyl-N-carboxymethyl-N-hydroxyethylimidazolinium betaines; glycine-based surfactants, such as alkyldiethylene triaminoacetic acids and dialkyldiethylene triaminoacetic acids; and amine oxide-based surfactants, such as alkylamine oxides.

As such a ligand contained in the reducing agent-containing treatment liquid, any ligand can be used as long as the ligand coordinates to ruthenium or ruthenium oxide, and from the viewpoint of easily coordinating to ruthenium or ruthenium oxide and forming a more stable complex, a ligand containing a heteroatom, that is, an oxygen atom, a nitrogen atom, a sulfur atom, or a phosphorus atom, is preferable. Examples of such ligands include, but are not limited to, ligands having an amino group, a phosphino group, a carboxyl group, a carbonyl group or a thiol group, and nitrogen-containing heterocyclic compounds.

More specific examples of such ligands preferably include amines, such as triethanolamine, nitrilotriacetic acid, ethylenediamine tetraacetic acid and glycine; thiols, such as cysteine and methionine; phosphines such as tributylphosphine and tetramethylene bis(diphenylphosphine); monocarboxylic acids and esters thereof, such as acetic acid, formic acid, lactic acid, glycolic acid, 2,2-bis(hydroxymethyl) propionic acid, gluconic acid, α-gkicoheptonie acid, heptynoic acid, phenylacetic acid, phenylglycolic acid, benzilic acid, gallic acid, cinnamic acid, naphthoic acid, anisic acid, salicylic acid, cresotic acid, acrylic acid and benzoic acid; dicarboxylic acids and esters thereof; such as malic acid, adipic acid, succinic acid, maleic acid, tartaric acid, oxalic acid, dimethyl oxalate, glutaric acid, malonic acid, 1,3-adamantanedicarboxylic acid, diglycolic acid, and phthalic acid; tricarboxylic acids such as citric acid, and esters thereof; tetracarboxylic acids such as butane-1,2,3,4-tetracarboxylic acid, and esters thereof; hexacarboxylic acids such as 1,2,3,4,5,6-cyclohexanehexacarboxylic acid, and esters thereof; and carbonyl compounds such as ethyl acetoacetate and dimethylmalonic acid.

More preferable examples thereof include monocarboxylic acids and esters thereof; such as acetic acid, formic acid, lactic acid, glycolic acid, 2,2-bis(hydroxymethyl) propionic acid, gluconic acid, α-glucoheptonic acid, heptynoic acid, phenylacetic acid, phenylglycolic acid, benzilic acid, gallic acid, cinnamic acid, naphthoic acid, anisic acid, salicylic acid, cresotic acid, acrylic acid and benzoic acid; dicarboxylic acids and esters thereof, such as malic acid, adipic acid, succinic acid, maleic acid, tartaric acid, oxalic acid, dimethyl oxalate, glutaric acid, malonic acid, 1,3-adamantane dicarboxylic acid, and diglycolic acid; tricarboxylic acids such as citric acid, and esters thereof; tetracarboxylic acids such as butane-1,2,3,4-tetracarboxylic acid, and esters thereof; hexacarboxylic acids such as 1,2,3,4,5,6-cyclohexanehexacarboxylic acid, and esters thereof; and carbonyl compounds such as ethyl acetoacetate and dimethylmalonic acid.

Even more preferable examples include oxalic acid, dimethyl oxalate, 1,2,3,4,5,6-cyclohexanehexacarboxylic acid, succinic acid, acetic acid, butane-1,2,3,4-tetracarboxylic acid, dimethylmalonic acid, glutaric acid, diglycolic acid, citric acid, malonic acid, 1,3-adamantane dicarboxylic acid, and 2,2-bis(hydroxymethyl) propionic acid.

The nitrogen-containing heterocyclic compound refers to a compound having a heterocyclic ring containing one or more nitrogen atoms, and preferable examples include a piperidine compound, a pyridine compound, a piperazine compound, a pyridazine compound, a pyrimidine compound, a pyrazine compound, a 1,2,4-triazine compound, a 1,3,5-triazine compound, an oxazine compound, a thiazine compound, a cytosine compound, a thymine compound, a uracil compound, a pyrrolidine compound, a pyrroline compound, a pyrrole compound, a pyrazolidine compound, an imidazolidine compound, an imidazoline compound, a pyrazole compound, an imidazole compound, a triazole compound, a tetrazole compound, an oxazole compound, a thiazole compound, an oxadiazole compound, a thiadiazole compound, a thiazolidinedione compound, a succinimide compound, an oxazolidone compound, a hydantoin compound, an indoline compound, an indole compound, an indolizine compound, an indazole compound, an azaindazole compound, a purine compound, a benzisoxazole compound, a benzisothiazole compound, a benzoxazole compound, a benzothiazole compound, an adenine compound, a guanine compound, a carbazole compound, a quinoline compound, a quinolizine compound, a quinoxaline compound, a phthalazine compound, a quinazoline compound, a cinnoline compound, a naphthyridine compound, a pteridine compound, an oxazine compound, a quinolinone compound, an acridine compound, a phenazine compound, a phenoxazine compound, a phenothiazine compound, a phenoxathiin compound, a quinuclidine compound, an azaadamantane compound, an azepine and a diazepine compound. More preferable examples include, but are not limited to, a pyridine compound, a piperazine compound, a triazole compound such as a benzotriazole, a pyrazole compound and an imidazole compound. When the nitrogen-containing heterocyclic compound has isomers, the isomers can be used as ligands of the present embodiment without distinction. For example, when the nitrogen-containing heterocyclic compound is an indole compound, the indole compound can be 1H-indole, 2H-indole, 3H-indole, or a mixture of these. Further, the nitrogen-containing heterocyclic compound can be modified with any functional group and have a structure in which a plurality of rings are condensed. The nitrogen-containing heterocyclic compound can be a single type, or a plurality of types can be combined and used. As the ligand of the present embodiment, a nitrogen-containing heterocyclic compound and a ligand other than the nitrogen-containing heterocyclic compound can be combined and used.

When the above-described ligands have isomers, the present invention is not limited thereto. For example, lactic acid has a D-isomer and an L-isomer, but the ligand is not limited by the differences of such isomers.

Other additives that have been typically used in semiconductor treatment liquids can be added to the above-described reducing agent-containing treatment liquid, as desired, in a range that does not impair the object of the present invention. Examples of the other additives that can be added include an acid, an alkali, a metal corrosion inhibitor, an organic solvent, a fluorine compound, a complexing agent, a chelating agent, a surfactant, an antifoaming agent, a pH adjusting agent, and a stabilizing agent. The additive can be added alone, or a plurality of the additives can be added in combination.

The reducing agent-containing treatment liquid may contain a metal (or a metal ion, hereinafter referred to as a metal even in a case of a metal ion) originating from addition of the reducing agent and from the production of the treatment liquid. Examples of the metal contained include lithium, sodium, potassium, aluminum, magnesium, calcium, chromium, manganese, iron, nickel, cobalt, copper, silver, cadmium, barium, zinc, and lead, and ions of these metals. However, when left on a semiconductor wafer, these metals have an adverse effect on the semiconductor wafer (adverse effect such as reducing the yield of semiconductor wafers), and therefore a small presence amount of these metals is preferable. On the other hand, the content of metal in the treatment liquid is preferably small, but the flatness of the metal surface after the removal of ruthenium can be maintained (surface roughness can be prevented) by containing a small amount of metal in the treatment liquid. Therefore, as the content of metal, the content based on mass of any one metal selected from the group consisting of lithium, sodium, potassium, aluminum, magnesium, calcium, chromium, manganese, iron, nickel, cobalt, copper, silver, cadmium, barium, zinc, and lead is preferably 0.01 ppt or more and 1 ppb or less, more preferably 1 ppt or more and 1 ppb or less, even more preferably 10 ppt or more and 500 ppt or less, and most preferably 100 ppt or more and 200 ppt or less. In addition, organic impurities and inorganic impurities originating from the addition of the reducing agent may be contained. When, for example, a tetraalkylammonium borohydride solution is used, examples of the organic impurities that are contained include trimethylamines and alkyldimethylamines originating from the tetraalkylammonium. When, for example, a tetraalkylammonium borohydride solution is used, examples of the inorganic impurities that are contained include boric acid compounds and silicates originating from the borohydride compound. Examples of the boric acid compounds include boric acid and salts thereof, metaboric acid and salts thereof, tetraboric acid and salts thereof; and borax. Since these organic impurities and inorganic impurities can also become a particle source, the presence amount thereof is preferably small, and based on mass, the presence amount is preferably 100 ppm or less, more preferably 1 ppm or less, and most preferably 100 ppb or less.

(Method for Producing Reducing Agent-Containing Treatment Liquid)

The method for producing the reducing agent-containing treatment liquid of the present embodiment is not particularly limited, and can be determined with consideration of details such as the type of the reducing agent used and the solvent. For example, the reducing agent-containing treatment liquid can be produced by dissolving the reducing agent in the solvent. The method for dissolving the reducing agent in the solvent is not particularly limited, and can be determined with consideration of details such as the properties of the reducing agent and the physical properties of the solvent. When the reducing agent is a solid or a liquid, the reducing agent can be added to a solvent and mixed and dissolved, and as necessary, stirring, heating or the like can be carried out. In addition, part of the reducing agent can be dissolved, or the reducing agent can be in a suspension state. When the reducing agent is a gas, the reducing agent-containing treatment liquid of the present embodiment can be obtained by dissolving the reducing agent in a solvent. In addition, an additive typically used in a semiconductor treatment liquid can be added, as desired.

Implementing filtration to remove impurities in the reducing agent-containing treatment liquid is one preferable mode as a semiconductor treatment method of the present embodiment. The filtration method is not particularly limited, and a filtration method widely known as a method for filtering a treatment liquid for a semiconductor can be suitably used. Examples thereof include filtration under reduced pressure, pressurized filtration, and filtration through a filter. When filtration through a filter is carried out, an organic polymeric filter is preferably used. Examples of such a filter include a filter made of a polyolefin-based resin or a fluorine-based resin. The filtration can be carried out at the time of manufacturing or before the semiconductor wafer is treated.

In the production of the reducing agent-containing treatment liquid, a container in which the surface in contact with the reducing agent-containing treatment liquid is formed of a resin or glass is preferably used in order to prevent increases in particles and the amount of metal in the reducing agent-containing treatment liquid. The content of particles and metals in a reducing agent-containing treatment liquid produced using such a container is low, and thus such a reducing agent-containing treatment liquid is less likely to cause a decrease in yield in semiconductor manufacturing. Examples of such a resin include a polyolefin-based resin and a fluorine-based resin. Furthermore, with respect to storage of the reducing agent-containing treatment liquid as well, the reducing agent-containing treatment liquid is preferably stored in a container in which the surface in contact with the reducing agent-containing treatment liquid is formed of a resin, and is more preferably stored in a container in which the surface in contact with the reducing agent-containing treatment liquid is formed of an organic polymer such as a polyolefin-based resin or a fluorine-based resin. By storing the reducing agent-containing treatment liquid in such a container, decomposition of the reducing agent contained in the reducing agent-containing treatment liquid is prevented, and the reducing agent-containing treatment liquid can be stably stored, and in addition, the reduction rate of the ruthenium oxide is stabilized. Moreover, if the reducing agent and other components contained in the reducing agent-containing treatment liquid are unstable when exposed to light, the reducing agent-containing treatment liquid is preferably stored in a light-shielded state. Further, as necessary, the reducing agent-containing treatment liquid can be produced and stored in an inert gas atmosphere.

(Removal of Ruthenium Oxide Using an Alkali)

As the step of removing ruthenium oxide, a method of removing ruthenium oxide using an alkaline solution can be suitably used. By bringing the alkaline solution into contact with the ruthenium oxide, at least part of the ruthenium oxide can be dissolved in the alkaline solution and removed. Removing the ruthenium oxide enables etching of the ruthenium at a sufficient rate and inhibits a decrease in flatness after etching.

The alkaline solution in the present embodiment contains an alkali and a solvent. The alkali in the present embodiment can be an inorganic alkali or an organic alkali. Examples of the inorganic alkali include alkali metal hydroxides, alkali metal carbonates, alkali metal hydrogen carbonates, alkali metal bicarbonates, alkaline earth metal hydroxides, alkaline earth metal carbonate, alkaline earth metal hydrogen carbonates, ammonia, ammonium carbonate, and metal alkoxides. Examples of the alkali metal hydroxides include lithium hydroxide, sodium hydroxide, potassium hydroxide, and cesium hydroxide. Examples of the alkali metal carbonates include lithium carbonate, sodium carbonate, potassium carbonate, and cesium carbonate. Examples of the alkali metal hydrogen carbonates include sodium hydrogen carbonate and potassium hydrogen carbonate. Examples of the alkali metal bicarbonates include sodium bicarbonate, potassium bicarbonate, and lithium bicarbonate. Examples of the alkaline earth metal hydroxides include calcium hydroxide. Examples of the alkaline earth metal carbonates include calcium carbonate. Examples of the alkaline earth metal hydrogen carbonates include calcium hydrogen carbonate. Examples of the metal alkoxides include sodium methoxide, potassium methoxide, sodium ethoxide, potassium ethoxide, and sodium tert-butoxide.

Examples of the organic alkali include amines and alkylammonium hydroxides. Examples of the amines include tertiary amines such as trimethylamine, triethylamine, diisopropylethylamine, tributylamine, and N-methylmorpholine; and aromatic amines such as pyridine, 4-dimethylaminopyridine, imidazole, and 1-methylimidazole. Examples of the alkylammonium hydroxides include tetramethylammonium hydroxide, tetraethylammonium hydroxide, tetrapropylammonium hydroxide, tetrabutylammonium hydroxide and choline.

Among these alkalis, sodium hydroxide, potassium hydroxide, lithium hydroxide, sodium carbonate, sodium hydrogen carbonate, ammonia, triethylamine, pyridine, and alkylammonium hydroxides are preferable from the viewpoints of low cost and ease of procuring high purity products. Furthermore, ammonia, triethylamine, alkylammonium hydroxides, and choline are more preferable from the viewpoint of not containing a metal that is problematic in semiconductor manufacturing. From the viewpoint of being able to industrially procure a high-purity product for semiconductor manufacturing with ease, tetramethylammonium hydroxide or choline is most preferable. These alkalis can each be used alone, or a plurality can be used in combination.

The solvent used in the alkaline solution is not particularly limited, and water or an organic solvent can be used. The solvent can be a single type, or multiple types of solvents can be contained. Examples of the organic solvent include alcohols such as methanol, ethanol and 2-propanol, and ketones such as acetone.

The use of water as a solvent for the alkaline solution in the present embodiment is one preferable mode. The water contained in the alkaline solution is preferably water from which metal ions, organic impurities, particles, or the like have been removed by distillation, ion exchange, filtration, various types of adsorption, or the like, and pure water or ultrapure water is particularly preferable.

The concentration range of the alkali contained in the alkaline solution can be determined with consideration of details such as the type of alkali used, the removal efficiency of the ruthenium oxide, and handling safety, and as an example, the concentration range thereof is preferably 0.05 mol/L or more and 15 mol/L or less, more preferably 0.1 mol/L or more and 10 mol/L or less, even more preferably 0.1 mol/L or more and 5 mol/L or less, and particularly preferably 0.1 mol/L or more and 2 mol/L or less. Moreover, the pH of the alkaline solution is preferably 10 or higher, more preferably 11 or higher, and most preferably 11 or higher and 14 or lower. When the concentration and pH are within the above ranges, the ruthenium oxide can be favorably dissolved and removed.

In a case in which, for example, a solution of an alkali metal hydroxide is used as the alkaline solution in the present embodiment, in consideration of the removal efficiency of the ruthenium oxide and handling safety, the concentration range of the alkali metal hydroxide solution is preferably 0.05 mol/L or more and 5 mol/L or less, more preferably 0.1 mol/L or more and 5 motif, or less, and most preferably 0.1 mol/L or more and 2 mol/L or less.

In a case in which, for example, an aqueous ammonia solution is used as the alkaline solution in the present embodiment, in consideration of the removal efficiency of the ruthenium oxide and handling safety, the concentration range of the aqueous ammonia solution is preferably 3 mol/L or more and 15 mol/L or less, more preferably 5 mol/L or more and 15 mol/L or less, and most preferably 9 mol/L or more and 15 mol/L or less.

In a case in which, for example, an aqueous solution of an alkylammonium hydroxide is used as the alkaline solution in the present embodiment, in consideration of the removal efficiency of the ruthenium oxide and handling safety, the concentration range of the aqueous solution of the alkylammonium hydroxide is preferably 0.05 mol/L or more and 3 mol/L or less, more preferably 0.1 mol/L or more and 3 mol/L or less, and most preferably 0.1 mol/L or more and 2 mol/L or less.

The temperature when removing the ruthenium oxide using the alkaline solution is not particularly limited, and can be determined with consideration of details such as the type and concentration of the alkali used, the removal efficiency of the ruthenium oxide, and the treatment safety. As one example, the temperature thereof can be 0° C. or higher and 90° C. or lower, is preferably 5° C. or higher and 60° C. or lower, and is more preferably 10° C. or higher and 50° C. or lower. When the temperature is within the above temperature range, the ruthenium oxide can be dissolved in the alkaline solution and removed.

The treatment time when removing the ruthenium oxide using the alkaline solution is not particularly limited and can be appropriately selected with consideration of details such as the type and concentration of the alkali used, the removal efficiency of the ruthenium oxide, the semiconductor element used, the thickness of the ruthenium oxide, or the like. As one example, the treatment time can be 0.1 minutes or more and 150 minutes or less, is more preferably 0.1 minutes or more and 120 minutes or less, and is most preferably 0.5 minutes or more and 60 minutes or less. When the treatment time is within the above time range, the ruthenium oxide can be favorably dissolved in the alkaline solution and removed.

The rinsing liquid after the treatment using the alkaline solution is not particularly limited, and rinsing with deionized water alone is sufficient.

Other additives that have been typically used in semiconductor treatment liquids can be added, as desired, to the alkaline solution in a range that does not impair the present invention. Examples of the other additives that can be added include a metal corrosion inhibitor, a water-soluble organic solvent, a fluorine compound, an oxidizing agent, a reducing agent, a complexing agent, a chelating agent, a surfactant, an antifoaming agent, a pH adjusting agent, and a stabilizing agent. The additive can be added alone, or a plurality of the additives can be added in combination.

(Method for Producing Alkaline Solution)

The method for producing the alkaline solution of the present embodiment is not particularly limited, and can be determined with consideration of details such as the type of the reducing agent used and the solvent. For example, the alkaline solution can be produced by dissolving the alkali in the solvent. The method for dissolving the alkali in the solvent is not particularly limited, and can be determined with consideration of details such as the properties and concentration of the alkali and the physical properties of the solvent. When the alkali is a solid or a liquid, the alkali can be added to the solvent and mixed and dissolved, and as necessary, stirring, heating or the like can be carried out. When the alkali is a gas, the alkaline solution of the present embodiment can be obtained by dissolving the alkali in the solvent. In addition, an additive typically used in a semiconductor treatment liquid can be added, as desired.

Implementing filtration to remove impurities in the alkaline solution is one preferable mode as a treatment method of the present embodiment. The filtration method is not particularly limited, and a filtration method widely known as a method for filtering a treatment liquid for a semiconductor can be suitably used. Examples thereof include filtration under reduced pressure, pressurized filtration, and filtration through a filter. When filtration through a filter is carried out, an organic polymeric filter is preferably used. Examples of such a filter include a filter made of a polyolefin-based resin or a fluorine-based resin. The filtration can be carried out during manufacturing or prior to treating the wafer.

In the production of the alkaline solution, a container in which the surface in contact with the alkaline solution is formed of a resin or glass is preferably used in order to prevent increases in particles and the amount of metal in the alkaline solution. The content of particles and metals in an alkaline solution produced using such a container is low, and thus such a alkaline solution is less likely to cause a decrease in yield in semiconductor manufacturing. Examples of such a resin include a polyolefin-based resin and a fluorine-based resin. For the storage of the alkaline solution as well, the alkaline solution is more preferably stored in a container in which the surface in contact with the alkaline solution is formed of an organic polymer such as a polyolefin-based resin or a fluorine-based resin. By storing the alkaline solution in such a container, decomposition of the alkali contained in the alkaline solution is prevented, the alkaline solution can be stably stored, and in addition, the dissolution rate of the ruthenium oxide is stabilized. Moreover, if the alkali and other components contained in the alkaline solution are unstable when exposed to light, the alkaline solution is preferably stored in a light-shielded state. Further, as necessary, the alkaline solution can be produced and stored in an inert gas atmosphere.

(Removal of Ruthenium Oxide by Sputtering)

In the step of removing the ruthenium oxide, a sputtering treatment can be suitably used to remove the ruthenium oxide. At least part of the ruthenium oxide can be removed by carrying out a sputtering treatment. Removing the ruthenium oxide enables etching of the ruthenium at a sufficient rate and inhibits a decrease in flatness after etching.

The type of gas used for sputtering is not particularly limited, and can be detei lined with consideration of details such as the site where ruthenium oxide is present, the removal rate, the selectivity with other chemical species present on the wafer, and the cost. The sputtering treatment can be reactive sputtering. When reactive sputtering is carried out, a gas containing oxygen, halogen, or the like can be used as the gas used for sputtering, but the type of gas is not limited as long as the gas can react with ruthenium oxide to remove the ruthenium oxide. Fluorine, chlorine, or bromine can be suitably used as the halogen gas.

Removing the ruthenium oxide by a sputtering treatment using an inert gas is one preferable mode for carrying out the present embodiment. Examples of such an inert gas include nitrogen, helium, neon, argon, krypton, and xenon. These inert gases can be used alone, or a plurality of these inert gases can be used in combination. The influence on ruthenium and other metals, oxides, nitrides, silicides, and the like contained in the wafer can be reduced by using an inert gas. Specifically, a large change in the oxidation state, bonding state, abundance ratio, and the like of these chemical species before and after the sputtering treatment can be inhibited. As a result, a significant change in the physical properties, electrical characteristics, and the like of the semiconductor element can be prevented. Sputtering using argon gas is more preferable because the removal rate of ruthenium oxide is high and the ruthenium oxide can be efficiently removed.

In the sputtering, sputtering conditions such as the acceleration voltage, vacuum degree, gas concentration, sputtering time, and wafer temperature are not particularly limited, and can be appropriately determined in consideration of details such as the removal efficiency of ruthenium oxide is removed, the characteristics of the sputtering device, productivity, and cost. For example, the value of the acceleration voltage is preferably from 0.5 kV to 3 kV. In consideration of the fact that the ion implantation effect increases when the acceleration voltage is too high, the acceleration voltage is more preferably from 0.5 to 2 kV, and most preferably from 1 to 2 kV depending on the device used. When the acceleration voltage is within the above range, the ruthenium oxide can be removed.

The time required for the sputtering treatment is not particularly limited, and the sputtering treatment can be carried out until part or all of the ruthenium oxide is removed. The sputtering rate is also not particularly limited, and can be, for example, 0.1 nm/min or more and 5 nm/min or less, is preferably 0.25 nm/min or more and 3 nm/min or less, and is more preferably 0.5 nm/min or more and 3 nm/min or less.

Through the step of removing the ruthenium oxide by the sputtering described above, ruthenium can be removed at a faster and more stable rate, and a decrease in the flatness of ruthenium can be inhibited. Thus, the ruthenium oxide removal step of the present invention can be suitably used in an etching step, a residue removal step, a washing step, a CMP step, or the like in a semiconductor manufacturing process.

For example, for the purpose of removing ruthenium oxide generated when the ruthenium film is subjected to the CMP treatment or for the purpose of removing a natural oxide layer on the ruthenium surface, the ruthenium oxide removal step of the present embodiment can be carried out before the ruthenium removal step. Alternatively, for the purpose of removing ruthenium oxide produced when ruthenium is removed using an oxidizing agent or for the purpose of removing ruthenium oxide produced when ruthenium is etched, the ruthenium oxide removal step of the present embodiment can also be carried out after the ruthenium removal step. The ruthenium oxide removal step can be carried out once or a plurality of times. When the ruthenium oxide removal step is carried out a plurality of times, the method can be any of a method using a reducing agent-containing treatment liquid, a method using an alkaline solution, and a method using sputtering, and can be carried out any number of times and in any order.

<Ruthenium Removal Step>

The semiconductor treatment method of the present embodiment includes a ruthenium removal step. The method for removing ruthenium is not particularly limited, and a widely known method for removing ruthenium can be used. For example, wet etching or dry etching can be suitably used.

Carrying out the ruthenium removal step through wet etching is a preferable mode of the present embodiment. By combining the ruthenium oxide removal step and the step of removing ruthenium by wet etching, or by carrying out these steps a plurality of times, ruthenium can be etched at a sufficient rate, and a decrease in the flatness of the ruthenium surface after etching can be prevented. A case in which the ruthenium removal step is carried out by wet etching will be described in detail below.

As a treatment liquid used for wet etching ruthenium, a solution known as a treatment liquid for ruthenium can be used without any limitation. For example, ruthenium can be wet etched using a treatment liquid containing an oxidizing agent and a solvent. Examples of such a treatment liquid include a solution containing, as an oxidizing agent, a halogen oxyacid, permanganic acid and salts or ions thereof, hydrogen peroxide, ozone, cerium (IV) salts, or the like. Here, examples of the halogen oxyacids include hypochlorous acid, hypobromous acid, hypoiodous acid, chlorous acid, bromous acid, iodous acid, chloric acid, bromic acid, iodic acid, perchloric acid, perbromic acid, and periodic acid (orthoperiodic acid, metaperiodic acid). Because of the high etching rate of ruthenium and the unlikely decrease in flatness of the surface, the treatment liquid preferably contains, as the oxidizing agent, a halogen oxyacid and a salt or ion thereof. Among these, from the viewpoint of easily adjusting the etching rate, the oxidizing agent is more preferably hypochlorous acid, periodic acid (orthoperiodic acid, metaperiodic acid), or a salt thereof, and is most preferably hypochlorous acid or a hypochlorite.

The concentration of the oxidizing agent can be determined with consideration of details such as the type of the oxidizing agent, the film thickness of ruthenium, and the etching conditions (treatment temperature, treatment time, pH, etc.), and is preferably 0.0001 mass % or more and 20 mass % or less. When the concentration is within this range, ruthenium is sufficiently dissolved, etching is carried out, and a flat surface can be obtained.

The treatment liquid of the present embodiment contains a solvent. The solvent is not particularly limited, and water or an organic solvent can be used. The solvent can be a single type, or multiple types of solvents can be contained. In a case in which an oxidizing agent is contained in the treatment liquid, the solvent is preferably one that does not easily react with the oxidizing agent, but any solvent can be used as long as the solvent has low reactivity. Examples of such organic solvents include alkyl halides, ethers, acetonitrile, and sulfolane, or the like.

The use of water as the solvent of the treatment liquid of the present embodiment is one preferable mode. Water contained in the treatment liquid of the present embodiment is preferably water from which metal ions, organic impurities, particles, or the like have been removed by distillation, ion exchange, filtration, various types of adsorption, or the like, and pure water or ultrapure water is particularly preferable.

Other additives typically used in semiconductor treatment liquids can be added, as desired, to the treatment liquid of the present embodiment, within a range that does not impair the object of the present invention. Examples of the other additives that can be added include a metal corrosion inhibitor, a water-soluble organic solvent, a fluorine compound, an oxidizing agent, a reducing agent, a complexing agent, a chelating agent, a surfactant, an antifoaming agent, a pH adjusting agent, and a stabilizing agent. The additive can be added alone, or a plurality of the additives can be added in combination.

In the treatment method of the present embodiment, the ruthenium oxide removal step and the ruthenium removal step are carried out in combination. The ruthenium oxide removal step can be carried out a plurality of times, and the ruthenium removal step can also be carried out a plurality of times. In addition, the ruthenium oxide removal step and the ruthenium removal step can be carried out in any order. Specifically, the ruthenium oxide removal step can be carried out first, followed by the ruthenium removal step or, once again, the ruthenium oxide removal step, or the ruthenium removal step can be carried out first, followed by the ruthenium oxide removal step. The number of times that the ruthenium oxide removal step is carried out can be, for example, 1 time, 2 times, 3 times, or 4 times or more, and is preferably 1 time, 2 times, or 3 times. The number of times that the ruthenium removal step is carried out can be, for example, 1 time, 2 times, 3 times, or 4 times or more, and is preferably 1 time, 2 times, or 3 times. By carrying out these steps, the ruthenium can be etched at a sufficient rate, and a decrease in the flatness of the ruthenium after etching can be inhibited. In a case in which the ruthenium oxide removal step is carried out using the above-described reducing agent-containing treatment liquid or the above-described alkaline solution, the treatment time is as described above. When the ruthenium removal step is carried out by wet etching, the wet etching is usually implemented for 0.1 minutes or more and 30 minutes or less, and is preferably implemented for 0.1 minutes or more and 10 minutes or less.

Hereinafter, a case in which a solution containing hypochlorite ions is used as a treatment liquid for wet etching ruthenium will be specifically described as an example. The solution containing hypochlorite ions is a treatment liquid containing hypochlorite ions and a solvent. These components will be described in order below.

The method for producing the hypochlorite ions contained in the solution containing hypochlorite ions is not particularly limited, and hypochlorite ions produced by any method can be suitably used in the treatment liquid according to the present embodiment. Examples of the method for producing hypochlorite ions include a method of adding hypochlorous acid or a salt thereof to a solvent. Examples of the hypochlorite include ammonium hypochlorite, tetraalkylammonium hypochlorite, sodium hypochlorite, potassium hypochlorite, calcium hypochlorite, magnesium hypochlorite, and hypochlorous acid. Among these, ammonium hypochlorite, tetraalkylammonium hypochlorite, or hypochlorous acid can be suitably used from the viewpoint of not containing a metal that is problematic in semiconductor manufacturing. Tetraalkylammonium hypochlorite is more preferable because it can be stably present even at a high concentration. Further, a solution containing hypochlorite ions can be obtained by blowing chlorine gas into the solvent. In this case, water or a solution containing hydroxide ions can be used as the solvent. For example, a tetraalkylammonium hypochlorite solution can be easily obtained by blowing chlorine gas into a tetraalkylammonium hydroxide solution.

The tetraalkylammonium hypochlorite is suitably a tetraalkylammonium hypochlorite containing a tetraalkylammonium ion having a carbon number from 1 to 20 per alkyl group. Specific examples of such a tetraalkylammonium hypochlorite include tetramethylammonium hypochlorite, tetraethylammonium hypochlorite, tetrapropylammonium hypochlorite, tetrabutylammonium hypochlorite, tetrapentylammonium hypochlorite, and tetrahexylammonium hypochlorite. Tetramethylammonium hypochlorite and tetraethylammonium hypochlorite are more preferable from the viewpoint of having a large amount of hypochlorite ions per unit weight. Tetramethylammonium hypochlorite is most suitable because high-purity products are readily available, and stability is relatively high. Tetramethylammonium hypochlorite can be added to the solvent as a salt, or can be generated by blowing chlorine gas into a tetramethylammonium hydroxide solution.

The concentration range of hypochlorite ions in the treatment liquid of the present embodiment is preferably 0.001 mass % or more and 20 mass % or less. When the concentration is within this range, ruthenium can be suitably dissolved. From the viewpoint of efficiently dissolving and removing ruthenium and preventing a decrease in the flatness of the ruthenium surface after etching, the concentration of hypochlorite ions is more preferably 0.01 mass % or more and 15 mass % or less, even more preferably 0.05 mass % or more and 10 mass % or less, and most preferably 0.1 mass % or more and 4 mass % or less.

In the treatment liquid of the present embodiment, the remainder other than the hypochlorite ions, the alkylammonium ions, the alkali component, and the other additives that can be added as necessary is the solvent. After the hypochlorite ions, the alkylammonium ions, the alkali component and the other additives have been mixed, the remainder is adjusted with a solvent such that the total is 100 mass %.

Another embodiment of the present invention is a method for manufacturing a semiconductor containing ruthenium, the manufacturing method including a method for treating the semiconductor containing ruthenium.

For example, the manufacturing method of the present embodiment can include, in addition to the treatment method described above, a known step used in a method for manufacturing a semiconductor, such as one or more steps selected from a wafer fabrication step, an oxide film formation step, a transistor formation step, a wiring formation step, and a CMP step.

<Treatment Liquid Production Method>

The method for producing the ruthenium treatment liquid of the present embodiment is not particularly limited, and a known method can be used, without any limitation, as the method for producing the ruthenium treatment liquid. For example, a method of dissolving, in the abovementioned solvent, an oxidizing agent described in the <Ruthenium Removal Step> section above can be suitably used. The method for dissolving the oxidizing agent in the solvent is not particularly limited, and a preferable method can be selected with consideration of details such as the properties of the oxidizing agent and the physical properties of the solvent. When the oxidizing agent is a solid or a liquid, the oxidizing agent can be added to the solvent, and then mixed and dissolved, and stirring, heating, or the like can be implemented as necessary. When the oxidizing agent is a gas, the oxidizing agent can be dissolved in and/or reacted with a solvent to obtain the ruthenium treatment liquid of the present invention. In addition, an additive typically used in a semiconductor treatment liquid can be added, as desired.

In the production of the ruthenium treatment liquid, a container in which the surface in contact with the treatment liquid is formed of a resin or glass is preferably used in order to prevent increases in particles and the amount of metal in the treatment liquid. The content of particles and metals in a ruthenium treatment liquid produced using such a container is low, and thus such a ruthenium treatment liquid is less likely to cause a decrease in yield in semiconductor production. Examples of such a resin include a polyolefin-based resin and a fluorine-based resin. Furthermore, tor storage of the treatment liquid as well, the treatment liquid is preferably stored in a container in which the surface in contact with the treatment liquid is formed of a resin or glass, and is more preferably stored in a container in which the surface in contact with the treatment liquid is formed of a polyolefin-based resin or a fluorine-based resin. When the treatment liquid is stored in such a container, decomposition of the oxidizing agent contained in the treatment liquid is prevented, the treatment liquid can be stably stored, and the etching rate of ruthenium is stabilized.

After the treatment liquid has been produced as described above, a ruthenium-based metal film and/or a ruthenium alloy film deposited on a base can be etched by the treatment liquid.

EXAMPLES

The present invention will be described more specifically below by examples, but the present invention is not limited to these examples.

(pH Measurement Method)

The pH of 10 mL of a measurement sample liquid prepared in each example and comparative example was measured using a tabletop pH meter (LAQUA F-73, available from Horiba, Ltd.). The pH was measured after the treatment liquid was prepared and stabilized at 25° C.

(Film Formation of Transition Metal and Amount of Change in Film Thickness)

Transition metal films used in the examples and comparative examples were formed as follows. A ruthenium film was obtained by forming an oxide film on a silicon wafer using a batch-type thermal oxidation furnace, and then forming a 1200 Å (±10%) film of ruthenium on the oxide film using a sputtering method. Similar to the formation of the ruthenium film, a molybdenum film was obtained by forming an oxide film on a silicon wafer using a batch-type thermal oxidation furnace, and then forming a 1200 Å film of molybdenum on the oxide film using a sputtering method. A tungsten film was obtained by forming a thermal oxide film in the same manner, and then forming a 8000 Å film of tungsten through the CVD method. The sheet resistance was measured with a four-probe resistance measuring instrument (Loresta-GP, available from Mitsubishi Chemical Analytech Co., Ltd.) and converted to a film thickness, and this was used as the film thickness of the transition metal before the etching treatment. The sheet resistance was also similarly measured with the four-probe resistance measuring instrument after the etching treatment and converted to a film thickness, and this was used as the film thickness of the transition metal after the etching treatment. The difference between the film thickness of the transition metal after the etching treatment and the film thickness of the transition metal before the etching treatment was used as an amount of change in the film thickness before and after the etching treatment.

(Method for Calculating Etching Rate of Transition Metal)

For each of the examples and comparative examples, a fluorine-based resin container with a lid (94.0-mL PFA container, available from As One Corporation) was charged with 60 mL of a treatment liquid prepared in the examples and comparative examples. Each sample piece formed to a size of 10×20 mm was immersed in the treatment liquid at 25° C. for a predetermined amount of time of 0.5 minutes or longer and 2 minutes or less, and the transition metal was etched.

A value obtained by dividing the amount of change in the film thickness before and after the etching treatment by the immersion time was calculated as the etching rate and evaluated as the etching rate of the present invention. When the amount of change in film thickness before and ater the treatment was less than 5 Å, it was determined that the film was not etched.

(Method for Confirming Transition Metal Oxide)

The presence or absence of ruthenium oxide before and after removal of the transition metal oxide was confirmed using an X-ray photoelectron spectrometer (ESCA5701ci/MC, available from ULVAC-PHI, Inc.). The measurement was implemented with the X-ray source set to monochromatic Al-Kα, the aperture diameter set to φ800 μm, and the photoelectron extraction angle set to 45°, and peak analysis of Ru-3d and O-1s was carried out to determine the presence or absence of ruthenium oxide. The film thickness of the ruthenium oxide was determined by measurement in the depth direction (depth profile) using an X-ray photoelectron spectrometer.

(Flatness Evaluation Method)

After etching the sample piece, the surface of the sample piece was observed using an electronic microscope (JSM-7800F Prime, available from JEOL Ltd.) at an acceleration voltage of 10 kV and with a detector under UED conditions. At this time, the surface roughness state was evaluated according to the following criteria.

A: No roughening of the surface was observed.

B: Roughening of the surface was slightly observed.

C: Roughening of the surface was observed on the entire surface, but the roughness was shallow.

D: Roughening of the surface was observed on the entire surface, and the roughness was deep.

Example 1

(Preparation of Sample to be Subjected to Transition Metal Oxide Removal and Etching)

A ruthenium film was formed by the method described in the (Film formation of transition metal and amount of change in film thickness) section, the film was cut to a sample piece having a size of 10×20 mm, and the sample piece was used for evaluation. The presence of ruthenium oxide on the ruthenium film prior to removal of the ruthenium oxide was confirmed by the (Method for Confirming Transition Metal Oxide) described above. At this time, the ruthenium oxide was approximately 1 nm thick.

(Treatment with Reducing Agent-Containing Treatment Liquid)

In a fluorine-based resin container with a lid (94.0-mL PFA container, available from As One Corporation), 0.6 g of sodium borohydride (available from Tokyo Chemical Industry Co., Ltd.) and 59.4 g of ultrapure water were mixed, and a 1.0 mass % reducing agent-containing treatment liquid was obtained. The pH at this time was 10.1. Immediately after preparation of the reducing agent-containing treatment liquid, the sample piece cut to a size of 10×20 mm was immersed in the reducing agent-containing treatment liquid at 25° C. for 1 minute to remove the ruthenium oxide. The presence or absence of ruthenium oxide on the ruthenium film after removal was confirmed by the above-described (Method for Confirming Transition Metal Oxide), and no ruthenium oxide was confirmed.

(Production of Treatment Liquid)

In a 2-L three-neck flask made of glass (available from Cosmos Bead Co., Ltd.), 209 g of a 25 mass % tetramethylammonium hydroxide aqueous solution and 791 g of ultrapure water were mixed, and a 5.2 mass % tetramethylammonium hydroxide aqueous solution was obtained. The pH at this time was 13.8.

A rotor (available from As One, 30 mm in total length×8 mm in diameter) was then placed in the three-necked flask, and a thermometer protecting tube (available from Cosmos Bead Co., Ltd., bottom-sealed type) and a thermometer were placed in one opening, and in another opening, the leading end of a PFA tube (F-8011-02, available from Flon Industry) connected to a chlorine gas cylinder and a nitrogen gas cylinder was immersed in the bottom of the solution, such that switch between chlorine gas and nitrogen gas could be made optionally. The remaining one opening was connected to a gas-washing bottle (gas-washing bottle, model No. 2450/500, available from As One Corporation) filled with a 5 mass % sodium hydroxide aqueous solution. Nitrogen gas with a carbon dioxide concentration of less than 1 ppm was then introduced from the PFA tube at 0.289 Pa·m$^3$/second (when converted to 0° C.) for 20 minutes to purge carbon dioxide in the gas phase. At this time, the carbon dioxide concentration in the gas phase was 1 ppm or less.

A magnetic stirrer (C-MAG HS10, available from As One Corporation) was placed in the bottom portion of the three-neck flask and rotated at 300 rpm to stir the contents, and while the periphery of the three-neck flask was cooled with ice water, chlorine gas (available from Fujiox Co., Ltd., specification purity 99.4%) was supplied at 0.059 Pam 3/second (when converted to 0° C.) for 180 minutes, and a mixed solution of a tetramethylammonium hypochlorite aqueous solution (oxidizing agent; 3.51 mass % equivalent, 0.28 mol/L) and tetramethylammonium hydroxide (0.09 mass % equivalent, 0.0097 mol/L) was prepared. The pH at this time was 12.

Next, as a pH adjustment step, a 5% hydrochloric acid aqueous solution was added to the treatment liquid until the pH reached 9.5, and thereby a mixed solution of a tetramethylammonium hypochlorite aqueous solution (oxidizing agent; corresponding to 3.51 mass %) and tetramethylammonium hydroxide (corresponding to 0.0005 mass %) was obtained as a treatment liquid.

(Evaluations)

The sample piece from which the ruthenium oxide was removed was washed with ultrapure water, and then the surface roughness (flatness) and the etching rate of ruthenium were evaluated using the treatment liquid immediately after production. The ruthenium etching rate was evaluated by the above-described (Method for Calculating Etching Rate of Transition. Metal). The surface roughness (flatness) was evaluated by the above-described (Flatness Evaluation Method).

Examples 2 to 12

In each of Examples 2 to 12, a reducing agent-containing treatment liquid was prepared in accordance with the composition described in Table 1 including the type of reducing agent and concentration of the reducing agent, the ruthenium oxide was removed by the same method as in Example 1, and etching and evaluations were carried out by the same methods as in Example 1.

Comparative Example 1

In Comparative Example 1, a treatment liquid was prepared in the same manner as in Example 1 with the exception that the ruthenium oxide was not removed. Further, an evaluation was carried out using a ruthenium film (sample piece) prepared in the same manner as in Example 1.

TABLE 1

| Examples | Composition of Reducing Agent-Containing Treatment Liquid | | | Reduction | Etching Treatment Conditions | | | | Etching Result | |
|---|---|---|---|---|---|---|---|---|---|---|
| | Type of Reducing Agent | Reducing Agent Concentration (mass %) | pH | Time (min) | TMAClO (mass %) *2 | TMAH (mass %) *3 | pH | Time (min) | ER *1 (Å/min) | Surface Roughness |
| Example 1 | $NaBH_4$ | 1.0 | 10.1 | 1.0 | 3.51 | 0.0005 | 9.5 | 1.0 | 210 | B |
| Example 2 | $NaBH_4$ | 10.0 | 10.6 | 1.0 | 3.51 | 0.0005 | 9.5 | 1.0 | 217 | B |
| Example 3 | $NaBH_4$ | 15.0 | 10.8 | 1.0 | 3.51 | 0.0005 | 9.5 | 1.0 | 215 | B |
| Example 4 | $NaBH_4$ | 0.2 | 9.4 | 1.0 | 3.51 | 0.0005 | 9.5 | 1.0 | 207 | C |

TABLE 1-continued

| | Composition of Reducing Agent-Containing Treatment Liquid | | | | | | | | | |
|---|---|---|---|---|---|---|---|---|---|---|
| | Type of | Reducing Agent | | Reduction | Etching Treatment Conditions | | | | Etching Result | |
| Examples | Reducing Agent | Concentration (mass %) | pH | Time (min) | TMAClO (mass %) *2 | TMAH (mass %) *3 | pH | Time (min) | ER *1 (Å/min) | Surface Roughness |
| Example 5 | $SnCl_2$ | 1.0 | 3.3 | 1.0 | 3.51 | 0.0005 | 9.5 | 1.0 | 202 | C |
| Example 6 | $Na_2SO_3$ | 1.0 | 9.4 | 1.0 | 3.51 | 0.0005 | 9.5 | 1.0 | 207 | C |
| Example 7 | $Na_2SO_3$ | 5.0 | 9.6 | 1.0 | 3.51 | 0.0005 | 9.5 | 1.0 | 210 | C |
| Example 8 | $Na_2SO_3$ | 10.0 | 9.8 | 1.0 | 3.51 | 0.0005 | 9.5 | 1.0 | 209 | C |
| Example 9 | $TMABH_4$ *4 | 0.2 | 9.4 | 1.0 | 3.51 | 0.0005 | 9.5 | 1.0 | 207 | C |
| Example 10 | $TMABH_4$ *4 | 1.0 | 10.3 | 1.0 | 3.51 | 0.0005 | 9.5 | 1.0 | 212 | B |
| Example 11 | $TMABH_4$ *4 | 5.0 | 10.8 | 1.0 | 3.51 | 0.0005 | 9.5 | 1.0 | 213 | B |
| Example 12 | KI | 1.0 | 7.4 | 1.0 | 3.51 | 0.0005 | 9.5 | 1.0 | 204 | B |
| Comparative Example 1 | — | — | — | — | 3.51 | 0.0005 | 9.5 | 1.0 | 176 | D |

*1 ER: etching rate
*2 TMAClO: tetramethylammonium hypochlorite
*3 TMAH: tetramethylammonium hydroxide
*4 $TMABH_4$.: tetramethylammonium borohydride

Examples 13 and 14

In Examples 13 and 14, the treatment with the reducing agent-containing treatment liquid was carried out in the same manner as in Example 1 with the exceptions that the type of the reducing agent and the concentration of the reducing agent were set in accordance with the compositions shown in Table 2, and subsequently, a treatment liquid was prepared in the following manner. In a fluorine-based resin container with a lid (94.0-mL PEA container, available from As One Corporation), 1.5 g of orthoperiodic acid dihydrate (available from Wako Pure Chemical Industries, Ltd., Wako Special Grade, 98.5 wt. %) and 57.0 g of ultrapure water were mixed to obtain a 5.0 mass % treatment liquid. Evaluations were carried out using a ruthenium film (sample piece) prepared in the same manner as in Example 1.

Comparative Example 2

In Comparative Example 2, a treatment liquid was prepared in the same manner as in Example 14 with the exception that the treatment (ruthenium oxide removal) with the reducing agent-containing treatment liquid was not carried out. In addition, an evaluation was conducted using a ruthenium film (sample piece) prepared in the same manner as in Example 1.

Example 15

A molybdenum film was formed by the method described in the (Film formation of transition metal and amount of change in film thickness) section above, the film was cut to a sample piece having a size of 10×20 mm, and this sample piece was used for evaluation. The presence of molybdenum oxide on the molybdenum film before removing the molybdenum oxide was confirmed by the above-described (Method for Confirming Transition Metal Oxide). At this time, the thickness of the molybdenum oxide was approximately 1.5 nm.

A molybdenum film (sample piece) was prepared by the operation described above, and a treatment liquid was prepared and evaluated in the same manner as in Example 1.

Example 16

A tungsten film was formed by the method described in the (Film formation of transition metal and amount of change in film thickness) section above, the film was cut to

TABLE 2

| | Composition of Reducing Agent-Containing Treatment Liquid | | | | | | | |
|---|---|---|---|---|---|---|---|---|
| | Type of | Reducing Agent | | Reduction | Etching Treatment Conditions | | Etching Result | |
| Examples | Reducing Agent | Concentration (mass %) | pH | Time (min) | $H_5IO_6$ (mass %) *5 | Time (min) | ER *1 (Å/min) | Surface Roughness |
| Example 13 | $NaBH_4$ | 1.0 | 10.1 | 1.0 | 5.0 | 1.0 | 199 | B |
| Example 14 | $TMABH_4$ *4 | 1.0 | 10.3 | 1.0 | 5.0 | 1.0 | 201 | B |
| Comparative Example 2 | — | — | — | — | 5.0 | 1.0 | 163 | D |

*1 ER: etching rate
*4 $TMABH_4$.: tetramethylammonium borohydride
*5 $H_5IO_6$: orthoperiodic acid a sample piece having a size of 10×20 mm, and this sample piece was used for evaluation. The presence of tungsten oxide on the tungsten film before removal of the tungsten oxide was confirmed by the above-described (Method for Confirming Transition Metal Oxide). The thickness of the tungsten oxide layer was approximately 1.3 nm.

A tungsten film (sample piece) was prepared by the operation described above, and a treatment liquid was prepared and evaluated in the same manner as in Example 1.

Examples 17 and 18

In Examples 17 and 18, sample pieces were prepared in the same manner as in Examples 15 and 16 so that the sample pieces to be used were those shown in Table 3, and treatment liquids were prepared and evaluated in the same manner as in Example 10.

Comparative Example 3

In Comparative Example 3, a treatment liquid was prepared in the same manner as in Example 15 with the exception that the molybdenum oxide was not removed. In addition, an evaluation was carried out using a molybdenum film (sample piece) prepared in the same manner as in Example 15.

Comparative Example 4

In Comparative Example 4, a treatment liquid was prepared in the same manner as in Example 16 with the exception that the tungsten oxide was not removed. In addition, an evaluation was carried out using a tungsten film (sample piece) prepared in the same manner as in Example 16.

Example 19

(Alkali Treatment)

In a fluorine-based resin container with a lid (94.0-mL PFA container, available from As One Corporation), 60 mL of a 0.1 mon, sodium hydroxide aqueous solution (available from Wako Pure Chemical Industries, Ltd.) were prepared. Subsequently, a sample piece having a size of 10×20 mm was immersed in the aqueous solution at 25° C. for 30 minutes to dissolve the ruthenium oxide. The presence or absence of ruthenium oxide on the ruthenium film after removal was confirmed by the above-described (Method for Confirming Transition Metal Oxide), and no ruthenium oxide was confirmed.

After the treatment with an alkali through the above-described operation, a treatment liquid was prepared in the same manner as in Example 1, and an evaluation was carried out using a ruthenium film (sample piece) prepared in the same manner as in Example 1.

Examples 20 to 27

In each of Examples 20 to 27, an alkali treatment was implemented in the same manner as in Example 19 and a treatment liquid was prepared in the same manner as in Example 1 to obtain a composition having the type of alkali and alkali concentration shown in Table 4, and evaluations were carried out using a ruthenium film (sample piece) prepared in the same manner as in Example 1.

TABLE 3

| Examples | Type of Transition Metal | Composition of Reducing Agent-Containing Treatment Liquid: Type of Reducing Agent | Reducing Agent Concentration (mass %) | pH | Reduction Time (min) | Etching Treatment Conditions: TMAClO (mass %) *2 | TMAH (mass %) *3 | pH | Time (min) | Etching Result: ER *1 (Å/min) | Surface Roughness |
|---|---|---|---|---|---|---|---|---|---|---|---|
| Example 1 | Ru | $NaBH_4$ | 1.0 | 10.1 | 1.0 | 3.51 | 0.0005 | 9.5 | 1.0 | 210 | B |
| Example 15 | Mo | $NaBH_4$ | 1.0 | 10.1 | 1.0 | 3.51 | 0.0005 | 9.5 | 1.0 | 131 | C |
| Example 16 | W | $NaBH_4$ | 1.0 | 10.1 | 1.0 | 3.51 | 0.0005 | 9.5 | 1.0 | 250 | C |
| Example 10 | Ru | $TMABH_4$ *4 | 1.0 | 10.3 | 1.0 | 3.51 | 0.0005 | 9.5 | 1.0 | 212 | B |
| Example 17 | Mo | $TMABH_4$ *4 | 1.0 | 10.3 | 1.0 | 3.51 | 0.0005 | 9.5 | 1.0 | 128 | C |
| Example 18 | W | $TMABH_4$ *4 | 1.0 | 10.3 | 1.0 | 3.51 | 0.0005 | 9.5 | 1.0 | 251 | C |
| Comparative Example 1 | Ru | — | — | — | — | 3.51 | 0.0005 | 9.5 | 1.0 | 176 | D |
| Comparative Example 3 | Mo | — | — | — | — | 3.51 | 0.0005 | 9.5 | 1.0 | 102 | D |
| Comparative Example 4 | W | — | — | — | — | 3.51 | 0.0005 | 9.5 | 1.0 | 212 | D |

*1 ER: etching rate

*2 TMAClO: tetramethylammonium hypochlorite

*3 TMAH: tetramethylammonium hydroxide

*4 $TMABH_4$:: tetramethylammonium borohydride

TABLE 4

| | Alkaline Solution Composition | | | Etching Treatment Conditions | | | | Etching Result | |
|---|---|---|---|---|---|---|---|---|---|
| Examples | Alkali Type | Alkali Concentration (mol/L) | pH | TMAClO (mass %) *2 | TMAH (mass %) *3 | pH | Time (min) | ER *1 (Å/min) | Surface Roughness |
| Example 19 | NaOH | 0.1 | 12.8 | 3.51 | 0.0005 | 9.5 | 1.0 | 205 | C |
| Example 20 | NaOH | 1.0 | 13.5 | 3.51 | 0.0005 | 9.5 | 1.0 | 228 | B |
| Example 21 | NaOH | 2.0 | 13.8 | 3.51 | 0.0005 | 9.5 | 1.0 | 221 | B |
| Example 22 | KOH | 1.0 | 13.7 | 3.51 | 0.0005 | 9.5 | 1.0 | 224 | B |
| Example 23 | $NH_4$ | 9.0 | 12.2 | 3.51 | 0.0005 | 9.5 | 1.0 | 199 | C |
| Example 24 | $NH_4$ | 15.0 | 12.7 | 3.51 | 0.0005 | 9.5 | 1.0 | 213 | B |
| Example 25 | TMAH *3 | 0.1 | 12.5 | 3.51 | 0.0005 | 9.5 | 1.0 | 209 | C |
| Example 26 | TMAH *3 | 1.0 | 13.4 | 3.51 | 0.0005 | 9.5 | 1.0 | 216 | B |
| Example 27 | TMAH *3 | 3.0 | 13.9 | 3.51 | 0.0005 | 9.5 | 1.0 | 210 | B |
| Comparative Example 1 | — | — | — | 3.51 | 0.0005 | 9.5 | 1.0 | 176 | D |

*1 ER: etching rate
*2 TMAClO: tetramethylammonium hypochlorite
*3 TMAH: tetramethylammonium hydroxide

Example 28

(Sputtering Treatment)

A sample piece having a size of 10×20 mm was subjected to a sputtering treatment using an ion gun (Differential Ion Gun 04-303A, available from Physical Electronics, Inc.) at a sputtering rate of 0.93 nm/min under conditions including argon gas as the inert gas, an accelerating voltage of 1 kV, and a raster of X=4 and Y=4, and a ruthenium oxide removal treatment was carried out. The presence or absence of ruthenium oxide on the ruthenium film after removal was confirmed by the above-described (Method for Confirming Transition Metal Oxide), and no ruthenium oxide was confirmed.

After the sputtering treatment through the above-described operation, a treatment liquid was prepared in the same manner as in Example 1, and evaluations were carried out using a ruthenium film (sample piece) prepared in the same manner as in Example 1.

Examples 29 to 31

In each of Examples 29 to 31, sputtering was implemented in the same manner as in Example 28 with the exceptions that the sputtering conditions were as described in Table 5. In addition, a treatment liquid was prepared in the same manner as in Example 1, and evaluations were carried out using a ruthenium film (sample piece) prepared in the same manner as in Example 1.

Example 32

(Film Formation of Ruthenium Dioxide and Amount of Change in Film Thickness)

An oxide film was formed on a silicon wafer using a batch-type thermal oxidation furnace, and a 1000 Å (±10%) film of ruthenium dioxide was formed on the oxide film using a sputtering method. The sheet resistance was measured with a four-probe resistance measuring instrument (Loresta-GP, available from Mitsubishi Chemical Analytech Co., Ltd.) and converted to a film thickness, and this was used as the film thickness of the ruthenium dioxide before the etching treatment. The sheet resistance was also similarly measured with the four-probe resistance measuring instrument after the etching treatment and converted to a film thickness, and this was used as the film thickness of the ruthenium dioxide after the etching treatment. The difference between the film thickness of the ruthenium dioxide after the etching treatment and the film thickness of the ruthenium dioxide before the etching treatment was used as an amount of change in the film thickness before and after the etching treatment.

TABLE 5

| | Sputtering Conditions | | Etching Treatment Conditions | | | | Etching Result | |
|---|---|---|---|---|---|---|---|---|
| Examples | Acceleration Voltage (kV) | Sputtering Rate (nm/min) | TMAClO (mass %) *2 | TMAH (mass %) *3 | pH | Time (min) | ER *1 (Å/min) | Surface Roughness |
| Example 28 | 1 | 0.93 | 3.51 | 0.0005 | 9.5 | 1.0 | 224 | B |
| Example 29 | 2 | 1.87 | 3.51 | 0.0005 | 9.5 | 1.0 | 219 | B |
| Example 30 | 3 | 2.84 | 3.51 | 0.0005 | 9.5 | 1.0 | 223 | B |
| Example 31 | 0.5 | 0.48 | 3.51 | 0.0005 | 9.5 | 1.0 | 208 | C |
| Comparative Example 1 | — | — | 3.51 | 0.0005 | 9.5 | 1.0 | 176 | D |

*1 ER: etching rate
*2 TMAClO: tetramethylammonium hypochlorite
*3 TMAH: tetramethylammonium hydroxide (Treatment with Reducing Agent-Containing Treatment Liquid)

In a fluorine-based resin container with a lid (94.0-mL PFA container, available from As One Corporation), 0.6 g of sodium borohydride (available from Tokyo Chemical Industry Co., Ltd.) and 59.4 g of ultrapure water were mixed, and a 1.0 mass % reducing agent-containing treatment liquid was obtained. The pH at this time was 10.1. Immediately after preparation of the reducing agent-containing treatment liquid, the 10×20 mm sample piece was immersed therein at 25° C. for 3 minutes to subject the ruthenium dioxide film to a treatment with the reducing agent-containing treatment liquid. When the ruthenium oxide was confirmed by the above-described (Method for Confirming Transition Metal Oxide), it was confirmed that some of the surface of the ruthenium dioxide film was reduced to ruthenium.

(Evaluations)

In a fluorine-based resin container with a lid (94.0 mL PFA container, available from As One Corporation), 60 mL of the treatment liquid prepared in the same manner as in Example 1 were prepared. A sample piece of 10×20 mm was immersed in the treatment liquid at 25° C. for one minute, the ruthenium produced through the reduction treatment was etched, and an evaluation was conducted.

(Method for Calculating Ruthenium Dioxide Etching Rate)

A value obtained by dividing the amount of change in the film thickness before and after the etching treatment by the immersion time was calculated as the etching rate, and was evaluated as the etching rate of Example 32.

Comparative Example 5

An etching treatment of the ruthenium dioxide film was carried out in the same manner as in Example 32 with the exception that the treatment with the reducing agent-containing treatment liquid (ruthenium oxide removal) was not implemented. Further, an evaluation was carried out in the same manner as in Example 32.

TABLE 6

| | Oxide Removal Conditions | | Etching Result |
|---|---|---|---|
| Examples | Removal Method | Treatment Liquid Composition | ER *1 (Å/min) |
| Example 32 | Reduction | 1.0 mass % $NaBH_4$ | 133 |
| Comparative Example 5 | — | TMAClO, TMAH, pH 9.5 | 2 |

*1 ER: etching rate

Examples 33 to 38

In each of Examples 33 to 38, the ruthenium oxide was removed in the same manner as in Example 1 with the exception that the reducing agent-containing treatment liquid was prepared using the solvent shown in Table 7. Furthermore, etching and evaluations were carried out by the same methods as in Example 1.

TABLE 7

| | Composition of Reducing Agent-Containing Treatment Liquid | | | | | | | | | |
|---|---|---|---|---|---|---|---|---|---|---|
| | Type of | Reducing Agent | | Reduction | Etching Treatment Conditions | | | | Etching Result | |
| Examples | Reducing Agent | Concentration (mass %) | Solvent | Time (min) | TMAClO (mass %) *2 | TMAH (mass %) *3 | pH | Time (min) | ER *1 (Å/min) | Surface Roughness |
| Example 1 | $NaBH_4$ | 1.0 | Water | 1.0 | 3.51 | 0.0005 | 9.5 | 1.0 | 210 | B |
| Example 33 | $NaBH_4$ | 1.0 | Methanol | 1.0 | 3.51 | 0.0005 | 9.5 | 1.0 | 218 | B |
| Example 34 | $NaBH_4$ | 1.0 | Ethanol | 1.0 | 3.51 | 0.0005 | 9.5 | 1.0 | 206 | B |
| Example 35 | $NaBH_4$ | 1.0 | IPA *6 | 1.0 | 3.51 | 0.0005 | 9.5 | 1.0 | 186 | C |
| Example 36 | $NaBH_4$ | 1.0 | Acetone | 1.0 | 3.51 | 0.0005 | 9.5 | 1.0 | 200 | B |
| Example 37 | $NaBH_4$ | 1.0 | Acetonitrile | 1.0 | 3.51 | 0.0005 | 9.5 | 1.0 | 188 | C |
| Example 38 | $NaBH_4$ | 1.0 | Hexane | 1.0 | 3.51 | 0.0005 | 9.5 | 1.0 | 179 | C |
| Comparative Example 1 | — | — | — | — | 3.51 | 0.0005 | 9.5 | 1.0 | 176 | D |

*1 ER: etching rate

*2 TMAClO: tetramethylammonium hypochlorite

*3 TMAH: tetramethylammonium hydroxide

*6 IPA: 2-propanol

Example 39

In Example 39, a treatment liquid was prepared in the same manner as in Example 1, and etching for one minute and evaluations were carried out in the same manner as Example 1 using a ruthenium film (sample piece) prepared in the same manner as in Example 1. Next, a reducing agent-containing treatment liquid was prepared in the same manner as in Example 1, and immediately after preparation of the reducing agent-containing treatment liquid, a sample piece from which the ruthenium had been etched was immersed in the reducing agent-containing treatment liquid at 25° C. for 1 minute to remove the ruthenium oxide. The sample piece from which the ruthenium oxide was removed was washed with ultrapure water, then etched for 1 minute in the same manner as in Example 1 using a treatment liquid produced in the same manner as in Example 1, and then evaluated.

Examples 40 to 49

In each of Examples 40 to 49, a treatment liquid was prepared in the same manner as in Example 1, etching was carried out for only the time shown by (1) in Table 8 using a ruthenium film (sample piece) prepared in the same manner as in Example 1, and an evaluation was implemented. Next, in the same manner as in Example 1 with the exception that the reducing agent-containing treatment liquid was prepared using the reducing agent shown in Table 8, a reduction treatment was carried out for only the time shown by (2) in Table 8, and the ruthenium oxide was removed. The sample piece from which the ruthenium oxide was removed was washed with ultrapure water, then etched for only the time shown in (3) of Table 8 using a treatment liquid produced in the same manner as in Example 1, and then evaluated. Subsequently, in the same manner as in Example 1 with the exception that the reducing agent-containing treatment liquid was prepared using the reducing agent shown in Table 8, a reduction treatment was carried out for only the time shown by (4) in Table 8, and the ruthenium oxide was removed. The sample piece from which the ruthenium oxide was removed was washed with ultrapure water, then etched for only the time shown in (5) of Table 8 using a treatment liquid produced in the same manner as in Example 1, and then evaluated.

Comparative Example 6

In Comparative Example 6, a treatment liquid was prepared in the same manner as in Example 1, and a ruthenium film (sample piece) prepared in the same manner as in Example 1 was used. The sample piece was etched for 2 minutes and evaluated in the same manner as in Example 1 with the exception that the ruthenium oxide was not removed.

Comparative Example 7

In Comparative Example 7, a treatment liquid was prepared in the same manner as in Example 1, and a ruthenium film (sample piece) prepared in the same manner as in Example 1 was used. The sample piece was etched for 1 minute and evaluated in the same manner as in Example 1 with the exception that the ruthenium oxide was not removed. Next, the sample piece was again etched for 1 minute using a treatment liquid produced in the same manner as in Example 1, and then evaluated.

Comparative Example 8

In Comparative Example 8, a treatment liquid was prepared in the same manner as in Example 1, and a ruthenium film (sample piece) prepared in the same manner as in Example 1 was used. The sample piece was etched for 5 minutes and evaluated in the same manner as in Example 1 with the exception that the ruthenium oxide was not removed.

Comparative Example 9

In Comparative Example 9, a reducing agent-containing treatment liquid was prepared in the same manner as in Example 1, and a ruthenium film (sample piece) prepared in the same manner as in Example 1 was used. The ruthenium oxide was removed and the sample piece was evaluated in the same manner as in Example 1 with the exception that the ruthenium was not etched.

TABLE 8

| | Composition of Reducing Agent-Containing Treatment Liquid | | Treatment Details | | | | | | | |
|---|---|---|---|---|---|---|---|---|---|---|
| | Type of | Reducing Agent | Etching | Reduction | Etching | Reduction | Etching | Etching Result | | |
| Examples | Reducing Agent | Concentration (mass %) | Treat-ment (1) | Treat-ment (2) | Treat-ment (3) | Treat-ment (4) | Treat-ment (5) | ER *1 (Å/min) | ED *7 (Å). | Surface Roughness |
| Example 1 | $NaBH_4$ | 1.0 | 0 min | 1 min | 1 min | 0 min | 0 min | 210 | 210 | B |
| Example 39 | $NaBH_4$ | 1.0 | 1 min | 1 min | 1 min | 0 min | 0 min | 198 | 396 | B |
| Example 40 | $NaBH_4$ | 1.0 | 0 min | 1 min | 1 min | 1 min | 0 min | 211 | 211 | B |
| Example 41 | $NaBH_4$ | 1.0 | 0 min | 1 min | 1.5 min | 0 min | 0 min | 202 | 303 | B |
| Example 42 | $NaBH_4$ | 1.0 | 0 min | 1 min | 2 min | 0 min | 0 min | 199 | 398 | C |
| Example 43 | $NaBH_4$ | 1.0 | 0 min | 1 min | 3 min | 0 min | 0 min | 181 | 542 | C |
| Example 44 | $NaBH_4$ | 1.0 | 0.5 min | 1 min | 1 min | 0 min | 0 min | 203 | 304 | A |
| Example 45 | $NaBH_4$ | 1.0 | 0 min | 1 min | 1 min | 1 min | 1 min | 214 | 428 | A |
| Example 46 | $NaBH_4$ | 1.0 | 0.5 min | 1 min | 1 min | 1 min | 1 min | 211 | 527 | A |
| Example 47 | $TMABH_4$ *4 | 1.0 | 1 min | 1 min | 1 min | 0 min | 0 min | 194 | 388 | B |
| Example 48 | $TMABH_4$ *4 | 1.0 | 0.5 min | 1 min | 1 min | 0 min | 0 min | 199 | 299 | A |
| Example 49 | $TMABH_4$ *4 | 1.0 | 0.5 min | 1 min | 1 min | 1 min | 1 min | 211 | 528 | A |
| Comparative Example 6 | — | — | 2 min | 0 min | 0 min | 0 min | 0 min | 139 | 278 | D |
| Comparative Example 7 | — | — | 1 min | 0 min | 1 min | 0 min | 0 min | 154 | 308 | D |
| Comparative Example 8 | — | — | 5 min | 0 min | 0 min | 0 min | 0 min | 100 | 502 | D |
| Comparative Example 9 | — | — | 0 min | 1 min | 0 min | 0 min | 0 min | 0 | 0 | A |

*1 ER: etching rate

*4 $TMABH_4$.: tetramethylammonium borohydride

*7: ED: total etching amount

The invention claimed is:

1. A method for treating a semiconductor of a transition metal, the method comprising:

a step of removing a transition metal oxide; and a step of removing the transition metal;

wherein the step of removing the transition metal oxide is a step of removing the transition metal oxide using a reducing agent-containing treatment liquid, an alkaline solution, or sputtering; and the step of removing the transition metal is carried out by wet etching; and a treatment liquid used in the wet etching is a solution containing a halogen oxyacid ion and not containing a reducing agent.

2. The method for treating a semiconductor of a transition metal according to claim 1, the method comprising the step of removing the transition metal oxide a plurality of times.

3. The method for treating a semiconductor of a transition metal according to claim 1, the method comprising the step of removing the transition metal a plurality of times.

4. The method for treating a semiconductor of a transition metal according to claim 1, wherein a concentration of a reducing agent contained in the reducing agent-containing treatment liquid is 0.1 mass % or more and 15 mass % or less.

5. The method for treating a semiconductor of a transition metal according to claim 1, wherein the reducing agent of the reducing agent-containing treatment liquid is a borohydride compound, hydrogen, a tin (II) compound, an iodide, sulfurous acid, a sulfite, hypophosphorous acid, or a hypophosphite.

6. The method for treating a semiconductor of a transition metal according to claim 1, wherein a concentration of an alkali contained in the alkaline solution is 0.05 mol/L or more and 15 mol/L or less.

7. The method for treating a semiconductor of a transition metal according to claim 1, wherein the alkali of the alkaline solution is an alkali metal hydroxide, an alkali metal carbonate, an alkali metal hydrogen carbonate, an alkaline earth metal hydroxide, an alkaline earth metal carbonate, an alkaline earth metal hydrogen carbonate, ammonia, ammonium carbonate, an amine, or an alkylammonium hydroxide.

8. The method for treating a semiconductor of a transition metal according to claim 7, wherein a concentration of the alkali metal hydroxide contained in the alkaline solution of the alkali metal hydroxide is 0.05 mol/L or more and 5 mol/L or less.

9. The method for treating a semiconductor of a transition metal according to claim 7, wherein a concentration of ammonia contained in the alkaline solution of ammonia is 3 mol/L or more and 15 mol/L or less.

10. The method for treating a semiconductor of a transition metal according to claim 7, wherein a concentration of the alkylammonium hydroxide contained in the alkaline solution of the alkylammonium hydroxide is 0.05 mol/L or more and 3 mol/L or less.

11. The method for treating a semiconductor of a transition metal according to claim 1, wherein the transition metal is Ru, Rh, Co, Cu, Mo, or W.

12. A method for manufacturing a semiconductor of a transition metal, the method comprising the method for treating a semiconductor of a transition metal according to claim 1.

* * * * *